(12) United States Patent
Suhara

(10) Patent No.: US 6,870,745 B2
(45) Date of Patent: Mar. 22, 2005

(54) PRINTED-BOARD SUPPORTING DEVICE, ELECTRIC-COMPONENT MOUNTING SYSTEM, AND PROCESS OF MANUFACTURING PRINTED-CIRCUIT BOARD

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 208 days.

(21) Appl. No.: 10/120,554

(22) Filed: Apr. 12, 2002

(65) Prior Publication Data

US 2002/0154491 A1 Oct. 24, 2002

(30) Foreign Application Priority Data

Apr. 23, 2001 (JP) ........................................ 2001-124209

(51) Int. Cl.[7] .................................................. H05K 7/04
(52) U.S. Cl. ...................... 361/807; 361/803; 361/760; 361/720; 29/744; 29/740; 29/741
(58) Field of Search ................................ 361/807, 803, 361/760, 720, 730, 748; 156/285; 716/15; 29/559, 740, 741, 744

(56) References Cited

U.S. PATENT DOCUMENTS

| | | | | |
|---|---|---|---|---|
| 4,951,240 A | * | 8/1990 | Fukino | ........................ 716/15 |
| 6,099,681 A | * | 8/2000 | Arikado et al. | .............. 156/285 |
| 6,412,768 B1 | * | 7/2002 | Peckham et al. | ........... 269/203 |
| 6,427,313 B2 | * | 8/2002 | Ishitani et al. | ................. 29/559 |

FOREIGN PATENT DOCUMENTS

| | | |
|---|---|---|
| JP | B2 2-13475 | 4/1990 |
| JP | A 6-334393 | 12/1994 |
| JP | A 8-153665 | 6/1996 |
| JP | A 10-163677 | 6/1998 |
| JP | A 11-195899 | 7/1999 |
| JP | A 11-204995 | 7/1999 |
| JP | B2 3074096 | 6/2000 |

* cited by examiner

*Primary Examiner*—Randy W. Gibson
*Assistant Examiner*—Hung S. Bui
(74) *Attorney, Agent, or Firm*—Oliff & Berridge, PLC

(57) ABSTRACT

A printed-board holding device for holding a printed board in a work system in which the printed board and a working head are moved relative to each other in a direction parallel with a top surface of the printed board so that the working head executes a desired operation in each of a plurality of predetermined portions of the top surface of the printed board. The printed-board holding device includes (a) a supporting member which is to be brought into contact with a central portion of a bottom surface of the printed board and is capable of supporting the central portion, and (b) a pressing member which is to be brought into contact with a central portion of the top surface and is capable of forcing the printed board toward the supporting member.

10 Claims, 12 Drawing Sheets

PRINTED-BOARD SUPPORTING DEVICE, ELECTRIC-COMPONENT MOUNTING SYSTEM, AND PROCESS OF MANUFACTURING PRINTED-CIRCUIT BOARD

BACKGROUND OF THE INVENTION

1. Field of the Invention

The present invention relates to a printed-board holding device, an electric-component mounting system and a method of manufacturing a printed circuit board, and more particularly to techniques for holding a printed board.

2. Discussion of Related Art

Many of printed boards have flexibility, since each of them is constituted by a relatively thin circuit board which consists of an electrically insulating material such as a synthetic resin, and a circuit pattern which consists of an electrically conductive material and which is formed on the circuit board. Therefore, where a top surface of the flexible printed board is subjected to an operation for mounting an electric component thereon, an operation for applying a high viscous fluid thereto or other operation, it is not possible to support the printed board with a flatness of the top surface being accurately maintained, unless the printed board is supported at a considerable multiplicity of points of its bottom surface.

Because of that, conventionally, the printed board is supported at its bottom surface by a printed-circuit-board supporting device when the printed board is subjected to an operation. For example, where the printed board has a flat bottom surface without any electric component mounted thereon or without any protrusion portion thereon, the printed-circuit-board supporting device is adapted to include a plate-like supporting member having a large flat supporting surface so that the printed circuit board can be supported at its bottom surface by this plate-like supporting member. For example, a printed-board supporting device described in JP-B2-H2-13475 is equipped with a printed-board supporting stand which is adapted to suck the entirety of the bottom surface of the printed board with application of a vacuum pressure to the bottom surface. The printed-board supporting stand has a multiplicity of sucking holes which open in a supporting surface of the supporting stand, so that the printed board can be sucked with supply of the vacuum pressure to the sucking holes. Since the printed board is sucked by the supporting stand, the printed board is forced onto the supporting surface so as to be flattened by the supporting surface, even if the printed board is convexed in a direction away from the bottom surface toward the top surface. Where the printed board is convexed in a direction away from the top surface toward the bottom surface, the printed board can be flattened by simply bringing the supporting stand into contact with the bottom surface of the printed board and then lifting up the printed board. That is, the downwardly-convexed printed board is flattened without application of the vacuum pressure from the printed-board supporting device, while the upwardly-convexed printed board is flattened by sucking the printed board with application of the vacuum pressure from the printed-board supporting device.

Where the printed board has electric components mounted on its bottom surface, namely, where the printed board has protrusion portions on its bottom surface, the printed board can not be supported at the entirety of the bottom surface. Conventionally, such a printed board having the protrusion portions is supported by a plurality of supporting pins, as in a printed-board supporting device described in JP-A-H11-195899. These supporting pins are brought into contact with respective portions of the bottom surface in which the protrusion portions are not located. In a printed-board supporting device described in JP-B2-3074096 in which a rubber-made suction cup is provided on a distal end portion of each of the supporting pins, the printed board is sucked by the suction cup with application of a vacuum pressure to the bottom surface through the suction cup, while being supported at the bottom surface by a distal end face of each of the supporting pins.

SUMMARY OF THE INVENTION

However, where the printed board is so convexed upwardly that the bottom surface is distant from the supporting member by a large distance, the printed board can not be necessarily sucked due to shortage of suction force which is provided by the applied vacuum pressure. Where the printed board has a multiplicity of plated through-holes formed therethrough in a direction of the thickness of the board, the applied vacuum pressure is likely to leak out through the plated through-holes, thereby reducing the suction force. Further, if the printed board has a creamed solder printed on its top surface, the creamed solder is likely to be sucked into the suction cup via the plated through-holes, causing reduction in the suction force.

The present invention was developed under the above-described background situation and has an object of making it possible to hold the printed board with its surface being assuredly flattened. The present invention provides a printed-board holding device, an electric-component mounting system and a method of manufacturing a printed circuit board as described in the following modes of the invention, each of which is numbered like the appended claims and depends from the other mode or modes, as needed, for easier understanding of the present invention. It is to be understood that the technical features or any combinations thereof disclosed in the present specification is not limited to what are described in the following modes. It is to be further understood that a plurality of elements or features included in any one of the following modes of the invention are not necessarily provided all together, and that the invention may be embodied with selected one or ones of the elements or features described with respect to the same mode.

(1) A printed-board holding device used for a work system in which a printed board and a working head are moved relative to each other in a direction parallel with a top surface of the printed board so that the working head applies high viscous fluid, mounts electric components or executes other operation in each of a plurality of predetermined portions of the top surface of the printed board, the printed-board holding device comprising: (a) a supporting member which is to be brought into contact with a central portion of a bottom surface of the printed board and is capable of supporting the central portion; and (b) a pressing member which is to be brought into contact with a central portion of the top surface and is capable of forcing the printed board toward the bottom surface.

The above-described printed board may be a printed-wiring board provided by a circuit substrate which has a printed circuit and on which the electric components (including electronic components) are not mounted, a printed-wiring board having a printed circuit on which the electric components are provisionally fixed by an adhesive agent or solder paste, or a printed-circuit board having a printed circuit electrically connected to some of the electric components mounted thereon.

The term "central portion" is the antonym of "peripheral portion". That is, the central portion corresponds to a non-peripheral portion, and does not necessary mean a center and a portion adjacent to the center.

The pressing member has a shape configured to permit the above-described operation to be executed in the predetermined portions of the top surface of the printed board. For example, the pressing member may be provided by a plate member having a plurality of through-holes formed in the thickness direction of the plate member, or may include at least one bar member, elongated plate member or columnar member. The bar member or elongated plate member is provided to force the top surface while taking such a posture that permits its longitudinal direction to be parallel with the top surface of the printed board. The columnar member is provided to force the top surface while taking such a posture that permits its axial direction to be perpendicular to the top surface of the printed board.

The supporting member has a shape configured, for example, in accordance with a state of the bottom surface of the printed board. The printed board may have the electric components already mounted on the bottom surface, or may not have the electric components. Where there does not exist any protrusion on the bottom surface of the printed board, namely, where there does not exist any electric component mounted on the bottom surface, the supporting member may be provided by a simple plate member. Where there exists a protrusion or protrusions on the bottom surface, the supporting member may be provided by a columnar member, or a plate member having a though-hole which is formed in such a manner that makes it possible to avoid interference of the plate member with the protrusion.

The pressing member and the supporting member are positioned on opposite sides of the printed board and cooperate with each other to grip the printed board, from opposite sides of the printed board. Therefore, even if the printed board has a portion convexed in a direction away from the bottom surface toward the top surface, or a portion convexed in a direction away from the top surface toward the bottom surface, the top surface is held flat. In the former case in which the printed board has the portion convexed in the direction away from the bottom surface toward the top surface, the printed board is pressed by the pressing member so as to be flattened. In the latter case in which the printed board has the portion convexed in the direction away from the top surface toward the bottom surface, the printed board is pressed by the supporting member so as to be flattened. The above-described operation is carried out while the printed board is being pressed and supported by the pressing member and the supporting member, whereby the printed board can be held with its top surface being held flat, without having to suck the printed board with application of a vacuum pressure. Thus, the operation can be reliably carried out on the top surface of the printed board even where the printed board has the portion convexed in the direction away from the bottom surface toward the top surface. Where the printed board is not sucked with application of a vacuum pressure to the printed board through a suction cup, the creamed solder printed on the top surface is not sucked into the suction cup even if the printed board has a multiplicity of plated through-holes. Further, this arrangement, in which the printed board is pressed by the pressing member positioned on the upper side of the printed board, eliminates even a need of providing the supporting member with a sucking function for sucking the printed board.

(2) A printed-board holding device according to mode (1), wherein at least one of the pressing member and the supporting member includes a plate member which has a plurality of through-holes formed through the plate member in a direction of a thickness of the plate member.

Where the pressing member consists of the plate member having the through-holes, the pressing member may be referred to as a pressing plate. The pressing plate needs to be adapted not to disturb the operation carried on to the printed board by the working head. For example, where the operating system consists of an electric-component mounting system designed for mounting the electric components onto the printed board, the pressing plate preferably has a thickness close to a thickness of the electric components which are to be mounted onto the printed board, more preferably has a thickness smaller than the thickness of the electric components. Where each of the supporting member and the pressing member consists of a plate member having the through-holes, it is possible to satisfactorily support or press the printed board which has the electric components already mounted on the bottom or top surface. It is noted that each of the through-holes may be enlarged such an extent that the through-hole should be referred to as an opening, or alternatively, the pressing or supporting plate may take such a form that the plate should be referred to as a pressing or supporting flame.

It is preferable that the plate member is made of a material having a light weight and a high rigidity. It is preferable that the plate member is made of duralumin or other light metal, or carbon-reinforced resin or other fiber reinforced resin that is synthetic resin reinforced by a fiber.

The plate member may consist of a solid member, or alternatively, may consist of a hollow member or dish-like member. Where the plate member consists of the dish-like member, it is preferable that a plurality of ribs are formed on one of opposite surfaces of the flat plate member so that the printed board can be pressed by a distal end face of each of the ribs. Further, the hollow member as the plate member may be provided by the dish-like member and a flat plate that is fixed onto the distal end faces of the ribs of the dish-like member. Each of the through-holes may be formed through the solid member as the plate member, or formed through at least one of the opposite plates of the hollow member as the plate member.

Where the printed board has the electric components already mounted on the bottom or top surface, the ribs may be arranged such that the electric components are accommodated in respective cavities which are defined by the ribs. If the cavities are adapted to accommodate therein the electric components mounted on the top surface, for example, images of the electric components previously mounted on the top surface are not taken, whereby necessary image processing is rapidly and accurately achieved without carrying out unnecessary image processing. The dish-like pressing plate (supporting plate) having the through-holes formed therethrough, or the lower (or upper) flat plate of the hollow pressing plate (supporting plate) having the through-holes formed therethrough may be considered as a cover member. The cover member may be adapted to cover the electric components already mounted on the surface, or may be adapted to cover a portion or portions of the printed board onto which the electric components are not be mounted.

(3) A printed-board holding device according to mode (1), wherein the pressing member includes a plate member which has a plurality of through-holes formed through the plate member in a direction of a thickness of the plate member, and wherein the supporting member includes a generally columnar member which has a distal end face to be brought into contact with the printed board.

In the present mode, even where the printed board has on its bottom surface protrusion portion or portions which are provided by, for example, the electric components mounted on the bottom surface, the printed board can be supported at its bottom surface by bringing the distal end face of the columnar member into contact with a portion of the bottom surface in which portion the protrusion portions are not located.

The columnar member may be provided by a rigid body, or may be provided by an elastic body as described in JP-A-H11-204995. Where the columnar member is provided by the elastic body, the columnar member may be formed either entirely or partially of the elastic body. Where the columnar member is partially formed of the elastic body, for example, a portion including the distal end face brought into contact with the bottom surface of the printed surface is formed of the elastic body.

(4) A printed-board holding device according to mode (2) or (3), comprising: a guide device which is capable of guiding movement of the plate member in the direction of the thickness and preventing movement of the plate member in the direction parallel with the top surface of the printed board; and a moving device which is capable of moving the plate member, guided by the guide device, in the direction of the thickness.

In the present mode, the plate member is moved in the direction of the thickness by the moving device, whereby the plate member is brought into contact with or separated from the printed board. It is also possible to move the printed board in the direction of the thickness, for bringing the printed board into contact with the plate member or separating the printed board from the plate member.

(5) A printed-board holding device according to any one of modes (2)–(4), wherein the plate member has, in a surface thereof opposed to the printed board, a protrusion portion which protrudes toward the printed board.

The protrusion portion may be brought into contact at a spot point or spot points with the printed board, or may be brought into contact at an elongated portion or portions with the printed board.

For example, even where the printed board has a slit or slits formed through the printed board in the thickness direction, or even where a multiplicity of electric components have been already mounted or will be mounted on at least one of the top and bottom surfaces of the printed board with a high density of the electric components, it is possible to press or support the printed board without interfering with the slit or the electric components.

(6) A printed-board holding device according to any one of modes (2)–(5), wherein the plate member is warped or curved to be convexed toward the printed board.

The warped or curved plate member is elastically deformed to be flattened when the plate member presses or supports the printed board. Where the supporting member is provided by the curved plate member, the supporting member is brought into contact with the central portion of the printed board in an elastic manner, making it possible to reliably obtain a pressing force which forces the central portion of the printed board toward the pressing member. Where the pressing member is provided by the curved plate member, the pressing member is brought into contact with the central portion of the printed board in an elastic manner, making it possible to reliably obtain a pressing force which forces the central portion of the printed board toward the supporting member.

(7) A printed-board holding device according to any one of mode (1)–(6), wherein the pressing member and the supporting member have respective portions which grip the same portion of the printed board from respective opposite sides of the printed board.

The warp or curve of the printed board can be eliminated, even by bringing the pressing member and the supporting member into contact with respective portions of the top and bottom surfaces of the printed board which portions are not aligned with each other. However, in that case, the curve of the printed board is likely to be increased unless the contact forces are accurately controlled to have suitable amounts. On the other hand, where the pressing member and the supporting member are adapted to have the respective portions which grip the same portion of the printed board from the respective opposite sides of the printed board, the respective portions of the pressing member and the supporting member are brought into contact with each other via the same portion of the printed board which is interposed between the respective portions of the pressing member and the supporting member. In this arrangement, even if the contact forces applied from the pressing and supporting members to the printed board are excessively enlarged, the curve of the printed board is not increased by such an excessively enlarged contact forces. Further, in this arrangement, the minimum distance between the pressing member and the supporting member is limited by the contact of the pressing member and the supporting member with each other via the printed board. Therefore, even if the pressing member and the supporting member have respective portions which are brought into contact with portions of the respective top and bottom surfaces of the printed board which are not aligned with each other, the respective portions of the pressing and supporting members are prevented from being excessively closed to each other, whereby the printed board is prevented from being further curved.

(8) An electric-component mounting system, comprising: (a) a component supplying device which is capable of supplying an electric component; (b) a printed-board holding device which includes a supporting member to be brought into contact with a central portion of a bottom surface of a printed board so as to support the central portion, and is capable of holding the printed board; (c) a mounting head which is capable of receiving the electric component from the component supplying device and mounting the electric components onto the printed board held by the printed-board holding device; and (d) a relative movement device which is capable of moving the mounting head and the component supplying device relative to each other, and moving the mounting head and the printed-board holding device relative to each other, wherein the printed-board holding device includes, in addition to the supporting member, a pressing member which is to be brought into contact with a central portion of a top surface of the printed board and is capable of forcing the printed board toward the bottom surface.

For example, the mounting head consists of a plurality of mounting heads which are disposed on a rotary disk rotatable about its axis such that the mounting heads are equiangular spaced from each other along a circle having its center on the axis of rotation of the rotary disk. The rotary disk may consist of an intermittent rotary disk which is intermittently rotatable about the rotation axis, or may consist of a rotary disk which is rotatable in opposite directions by desired angles. The intermittent rotary disk is intermittently rotated by a rotary-disk rotating device in the form of an intermittently rotating device, whereby the plurality of mounting heads are turned about the rotation axis of the intermittent rotary disk, for thereby sequentially moving the plurality of mounting heads to predetermined stop positions which are arranged along a circular path of turning of the mounting heads. The above-described component supplying device and printed-board holding device are provided in respective ones of the stop positions. The rotary disk is rotated by the rotary-disk rotating device in a selected one of the opposite directions by a desired angle, whereby the plurality of mounting heads are turned and then stopped in predetermined stop positions. In these cases, the rotary disk and the rotary-disk rotating device constitute a mounting-head moving device in the form of a mounting-head turning device.

The mounting heads may be disposed on a plurality of respective pivot members which are pivotable independently of each other about a common axis of turning. Each of the pivot members is turned 360° about the common axis of turning by a pivot-motion applying device such that the pivot members are successively stopped in at least one stop position at a predetermined time interval. Each of the mounting heads is held by the corresponding pivot member such that all of the mounting heads are spaced from the common axis of turning by a predetermined radial distance. In this case, the mounting-head turning device of the relative movement device is constituted by the pivot members and the pivot-motion applying device.

At least one of the mounting heads may be held by a movable member which is linearly movable in at least one of two mutually perpendicular directions in a plane. The movable member is moved by a movable-member moving device, whereby each mounting head is movable to any desired position in the above-indicated plane. In this case, the mounting-head moving device is constituted by the movable member and the movable-member moving device.

In these cases, the relative movement device is constituted to include the mounting-head moving device. The mounting heads and the mounting-head turning device cooperate with each other to constitute a mounting device. The mounting head and the mounting-head moving device (that is constituted to include the movable member and the movable-member moving device) also cooperate with each other to constitute the mounting device.

As described in JP-A-H10-163677, the rotary disk and the rotary-disk rotating device, or the pivot member and the pivot-motion applying device may be held by a movable member which is movable in two mutually perpendicular directions in a plane by a movable-member moving device. The axis of rotation of the rotary disk or the common axis of turning of the pivot members may consist of a straight line perpendicular to the surface of the printed board held by the printed-board holding device, for example, may consist of a vertical line. Alternatively, the axis of rotation of the rotary disk or the common axis of turning of the pivot members may be inclined with respect to a plane perpendicular to the surface of the printed board, for example, may be inclined with respect to a vertical plane. In this case, the mounting heads, the rotary disk, the rotary-disk rotating device, the movable member and the movable-member moving device cooperate with each other to constitute the mounting device. The relative movement device is constituted to include the rotary disk, the rotary-disk rotating device, the movable member and the movable-member moving device. Alternatively, the mounting heads, the plurality of pivot members, the pivot-motion applying device, the movable member and the movable-member moving device cooperate with each other to constitute the mounting device. The relative movement device is constituted to include the pivot members, the pivot-motion applying device, the movable member and the movable-member moving device.

The mounting head may be considered to include a component holder for holding the electric component. Alternatively, it may be considered that the mounting head does not include the component holder but includes a component-holder holding member for holding the component holder.

The printed-board holding device may be provided to be unmovable in a direction parallel with the surface of the printed board, or may be provided to be movable by a printed-board-holding-device moving device or printed-board moving device in at least one of two mutually perpendicular directions in a plane that is parallel with the surface of the printed board. In the latter case, the relative movement device is constituted to include the printed-board moving device.

The component supplying device may be provided to be unmovable, or may be provided to be movable by a component-supplying-device moving device. In the latter case, the relative movement device is constituted to include the component-supplying-device moving device.

In any one of the modes, the component supplying device is constituted to include, for example, a plurality of feeders and a feeder support stand or table on which the feeders are mounted such that supply portions of the feeders are arranged along a line. Each of the feeders accommodates therein a corresponding one of different kinds of the electric components. Each feeder may include a tape feeding device operable to feed a carrier tape which accommodates a succession of the electric components such that the electric components are fed to the component supply portion one after another. Alternatively, each feeder may be arranged to feed a succession of the electric components by oscillation, a ramp way, an air stream or a belt conveyor, or a combination thereof, such that the electric components are fed to the component supply portion one after another. In either of these cases, each feeder includes a component feeding device for feeding the electric components to the component supply portion, and a component accommodating device for accommodating therein the electric components.

Where the component supplying device is movable to supply the electric components, the feeder support table is moved by the component-supplying-device moving device in a direction of arrangement of the supply portions of the feeders, so that a selected one of the feeders is located in a predetermined component-supplying position. The line along which the supply portions of the feeders are arranged may be a straight line or a line other than the straight line, such as a circle, a circular arc (a part of a circle), a curve other than the circular arc, and a line which is a combination of those non-straight lines. Where the component supplying device is movable, the component feeding devices and the component accommodating devices of the feeders may be disposed on a common feeder main body so that the component feeding devices and the component accommodating devices are moved together when the feeder support table is moved. Alternatively, the component feeding devices and the component accommodating devices of the feeders may be disposed independently of each other. In the latter case, the component feeding device and the component accommodating device of each of the feeders may be disposed on respective separate movable stands so as to be movable independently of each other, or the component accommodating device may be fixedly disposed.

The component supplying device may be adapted to supply the electric components from a tray. The tray has a multiplicity of component-accommodating recesses each of which is provided for accommodating one of the electric components therein.

In the present mode, the electric components can be reliably mounted onto the top surface of the printed board that is held flat owing to the arrangement in which the printed board is supported by the supporting member while being pressed by the pressing member.

(9) A method of manufacturing a printed circuit board, by making a suction nozzle suck an electric component and mount the electric component onto each of a plurality of predetermined portions of a top surface of a printed board, wherein the electric component is mounted by the suction nozzle onto each of the plurality of predetermined portions, while the printed board is being restrained from opposite sides thereof by a supporting member which is held in contact with a central portion of a bottom surface of the printed board and supports the central portion, and a pressing member which is held in contact with a central portion of the top surface and forces the printed board toward the bottom surface.

In the present mode, the electric components can be reliably mounted onto the top surface of the printed board that is held flat owing to the arrangement in which the printed board is supported by the supporting member while being pressed by the pressing member.

(10) A method according to mode (9), wherein at least one of the supporting member and the pressing member is provided by a member having a shape which is configured such that the member is not brought into contact with portions of the printed board on each of which the electric component is mounted.

The above-described "portions of the printed board on each of which the electric component is mounted" are interpreted to mean portions onto which the electric components have been already mounted, where the supporting member is provided by the member having the above-described shape. The above-described "portions of the printed board on each of which the electric component is mounted" are interpreted to mean portions onto which the electric components have been already mounted or will be mounted, where the pressing member is provided by the member having the above-described shape.

(11) A method according to mode (10), wherein the member having the shape consists of a pressing plate or a supporting plate which has a plurality of through-holes formed therethrough.

In the present mode, it is possible to obtain the technical effects or advantages as described in the mode (2).

(12) A method according to mode (10), wherein at least one of the supporting member and the pressing member is provided by a generally columnar member, and wherein a distal end face of the columnar member is brought into contact with the printed board.

In the present mode, it is possible to obtain the technical effects or advantages as described in the mode (3).

(13) A method according to any one of modes (9)–(12), wherein the printed board has a plurality of sections separated from each other by at least one boundary portion which is located between the plurality of sections, and wherein at least one of the supporting member and the pressing member is brought into contact with the boundary portion, for restraining the printed board.

Since the electric components are not mounted onto the boundary portion, the above-described at least one of the supporting member and the pressing member is easily brought into contact with the boundary portion.

DETAILED DESCRIPTION OF THE PREFERRED EMBODIMENTS

Figure 1:
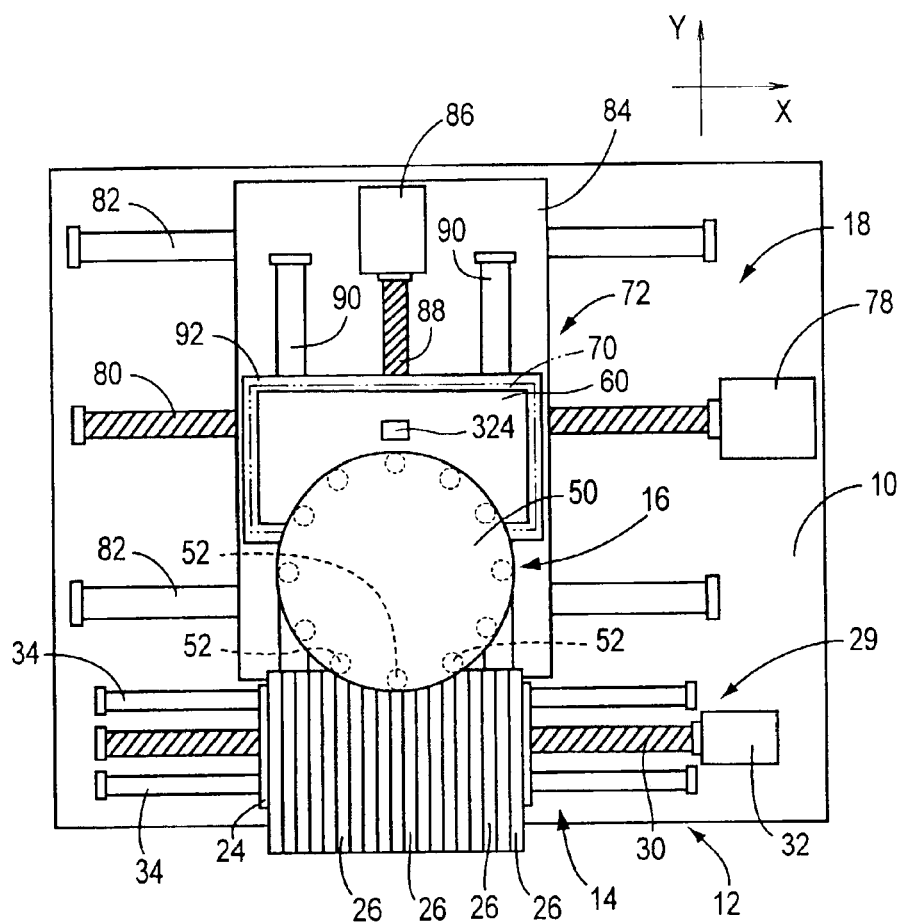
FIG. 1 is a schematic plan view of an electronic-component mounting system including a printed-wiring-board holding device which is constructed according to an embodiment of the present invention.

In FIG. 1, reference numeral 10 denotes a machine base of an electronic-component mounting system 12 as a kind of electric-component mounting system. On the base 10, there are mounted a component supplying device 14, a component mounting device 16 and a printed-board positioning device in the form of a printed-wiring-board positioning device 18, which cooperate to constitute the electronic-component mounting system 12.

The component supplying device 14 includes a plurality of feeders 26 mounted on a feeder support table 24. In the present embodiment, each of the feeders 26 is provided to feed electronic components 28 (see FIG. 3) each of which is a kind of electric component. Although the detailed illustration is not provided, each of the feeders 26 is arranged to feed a carrier tape which accommodates the electronic components 28. The carrier tape includes a carrier substrate which has a multiplicity of component-accommodating recesses. The electronic components 28 are accommodated in the respective component-accommodating recesses, and the opening of each recess is closed by a covering film bonded to the carrier substrate. The carrier tape is fed by a tape feeding device while the covering film is separated from the carrier substrate. Thus, the electronic components 28 are fed to a component supplying portion and then supplied one after another from the component supplying portion. The plurality of feeders 26 are removably mounted on the feeder support table 24 such that the component supply portions of the feeders 26 are arranged along a straight line, for example, along a horizontal straight line in the present embodiment. The direction of the arrangement of the component supply portions is referred to as an X-axis direction (right and left direction in FIG. 1).

The component supplying device 14 is moved by a component-supplying-device moving device 29 in the direction of the arrangement of the component supply portions. The feeder support table 24 is moved in the X-axis direction while being guided by a guide device including a pair of guide rails 34, by rotation of a feed screw in the form of a ball screw 30 by a support-table driving motor 32, so that a selected one of the feeders 26 can be moved to a component supply position. The ball screw 30 and the support-table driving motor 32 cooperate to constitute a major portion of the component-supplying-device moving device 29.

Figure 2:
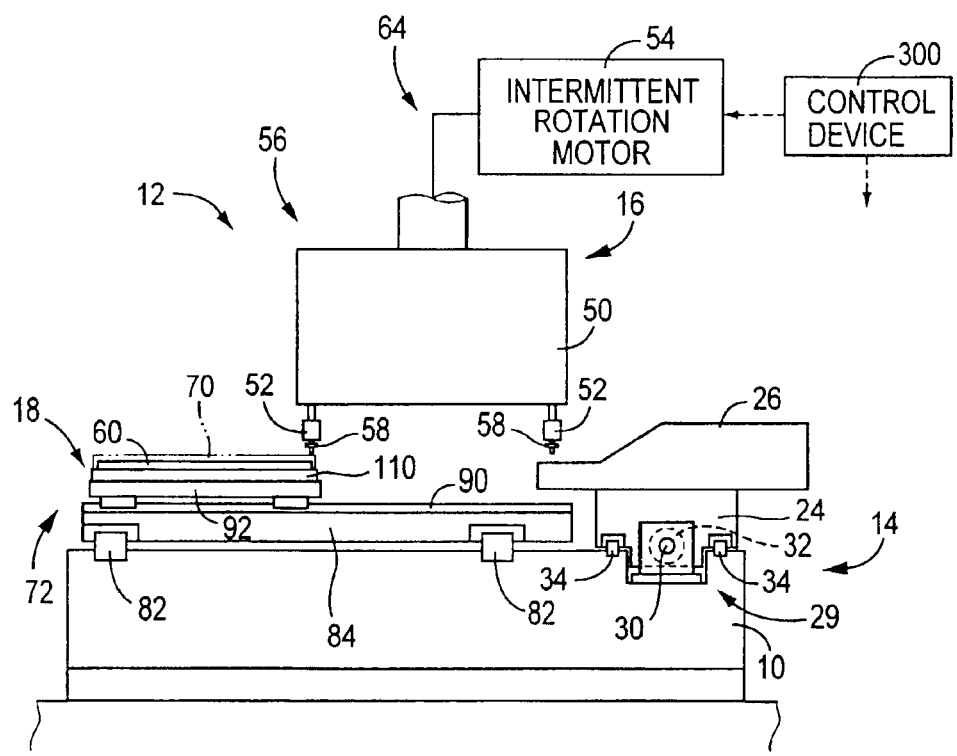
FIG. 2 is a schematic side view of the above-described electronic-component mounting system.

The mounting device 16 is constructed, for example, as a mounting device described in JP-A-H6-342998. In an example of the illustration, the mounting device 16 is equipped with an intermittent rotary body in the from of a intermittent rotary disk 50 which is intermittently rotatable about an axis, e.g., a vertical axis. The intermittent rotary disk 50 is equipped with a plurality of component holding devices in the form of mounting heads 52, such that the mounting heads 52 are equiangular spaced from each other along a circle having its center on the axis of rotation of the intermittent rotary disk 50. With activation of an intermittently rotating device 56 whose major portion is constituted by a cam, a cam follower, a rotary shaft (not shown) and an intermittent rotation motor 54 (see FIG. 2) which rotates the cam and the rotary shaft, the intermittent rotary disk 50 is intermittently rotated about the vertical axis by an angel equal to the angular spacing interval of the mounting heads 52, for each intermittent rotary motion. Thus, the mounting heads 52 are turned about a vertical axis of turning that is parallel with the axis of rotation of the intermittent rotary disk 50, whereby the mounting heads 52 are sequentially moved to and stopped at a plurality of stop positions such as a component-receiving or component-holding position in the form of a component-sucking position, a component-posture detecting position, a component-posture rectifying position and a component-mounting position. The intermittent rotary disk 50 and the intermittently rotating device 56 cooperate to constitute a mounting-head moving device in the form of a mounting-head turning device 64.

In the present embodiment, each of the mounting heads 52 is equipped with a component holder in the form of a suction nozzle 58 (see FIG. 2) which is adapted to suck the electronic component 28 with a vacuum pressure. Each mounting head 52 is held by the intermittent rotary disk 50 such that the mounting head 52 is held parallel with the axis of rotation of the rotary disk 50 and such that the mounting head 52 is rotatable about its axis and vertically movable in its axial direction. The mounting head 52 is vertically moved by a mounting-head moving device in the form of a mounting-head elevating device (not shown) which is disposed in each of the component receiving position and component mounting position, so that the mounting head 52 is movable toward and away from the printed-wiring board, for receiving and mounting the electronic component 28. The above-described component supply position corresponds to a position of the component supply portion of the feeder 26 which is located right below the suction nozzle 52 of the mounting head 52 when the mounting head 52 is stopped at the component receiving position.

The printed-wiring-board positioning device 18 will be explained.

In the present embodiment, the printed-wiring-board positioning device 18 is equipped with a printed-board holding device in the form of a printed-wiring-board holding device 70 which holds a printed-wiring board 60 or 354 as a kind of printed board (refer to FIG. 5 as to the printed-wiring board 354), and a printed-board moving device in the form of a printed-wiring-board moving device 72 which moves the printed-wiring-board holding device 70 and the a printed-wiring board 60 or 354, as shown in FIG. 1. It is noted that the printed-wiring-board moving device 72 serves also as a printed-wiring-board-holding-device moving device.

The printed-wiring-board moving device 72 is equipped with a X-axis slide 84 which is moved in the X-axis direction by a X-axis slide driving motor 78 and a feed screw in the form of a ball screw 80 while being guided by a guide device including guide rails 82, and a Y-axis slide 92 which is disposed on the X-axis slide 84 and is moved in a Y-axis direction by a Y-axis slide driving motor 86 and a feed screw in the form of a ball screw 88 while being guided by a guide device including guide rails 90.

The printed-wiring-board holding device 70 will be explained.

The printed-wiring-board holding device 70 is disposed on the Y-axis slide 92, and holds the printed-wiring board 60 or 354 such that the printed-wiring board 60 or 354 takes such a posture that permits its top surface 96 or 392 (see FIGS. 3 and 6) to be held horizontal. The top surface 96 or 392 corresponds to a mount surface onto which the electronic components 28 are to be mounted. The above-described Y-axis direction is parallel with the top surface 96 or 392 and a coordinate axis of a horizontal XY coordinate plane, and intersects the above-described X-axis direction at a right angle on the XY coordinate plane. The printed-wiring-board holding device 70 is moved by the printed-wiring-board moving device 72 on a plane parallel with the top surface 96 or 392, whereby a desired portion of the printed-wiring board 60 or 354 is positioned in a position corresponding to the component mounting position of the mounting device 16. The top surface 96 or 392 of the printed-wiring board 60 or 354 corresponds to an upper surface of the board 60 or 354 in the illustrated example. In the present embodiment, the printed-wiring-board moving device 72, the component-supplying-device moving device 29, the mounting-head turning device 64 and the mounting-head elevating device cooperate to constitute a relative movement device which moves the mounting head 52 relative to the component supplying device 14 and the printed-wiring-board holding device 70.

Figure 3:
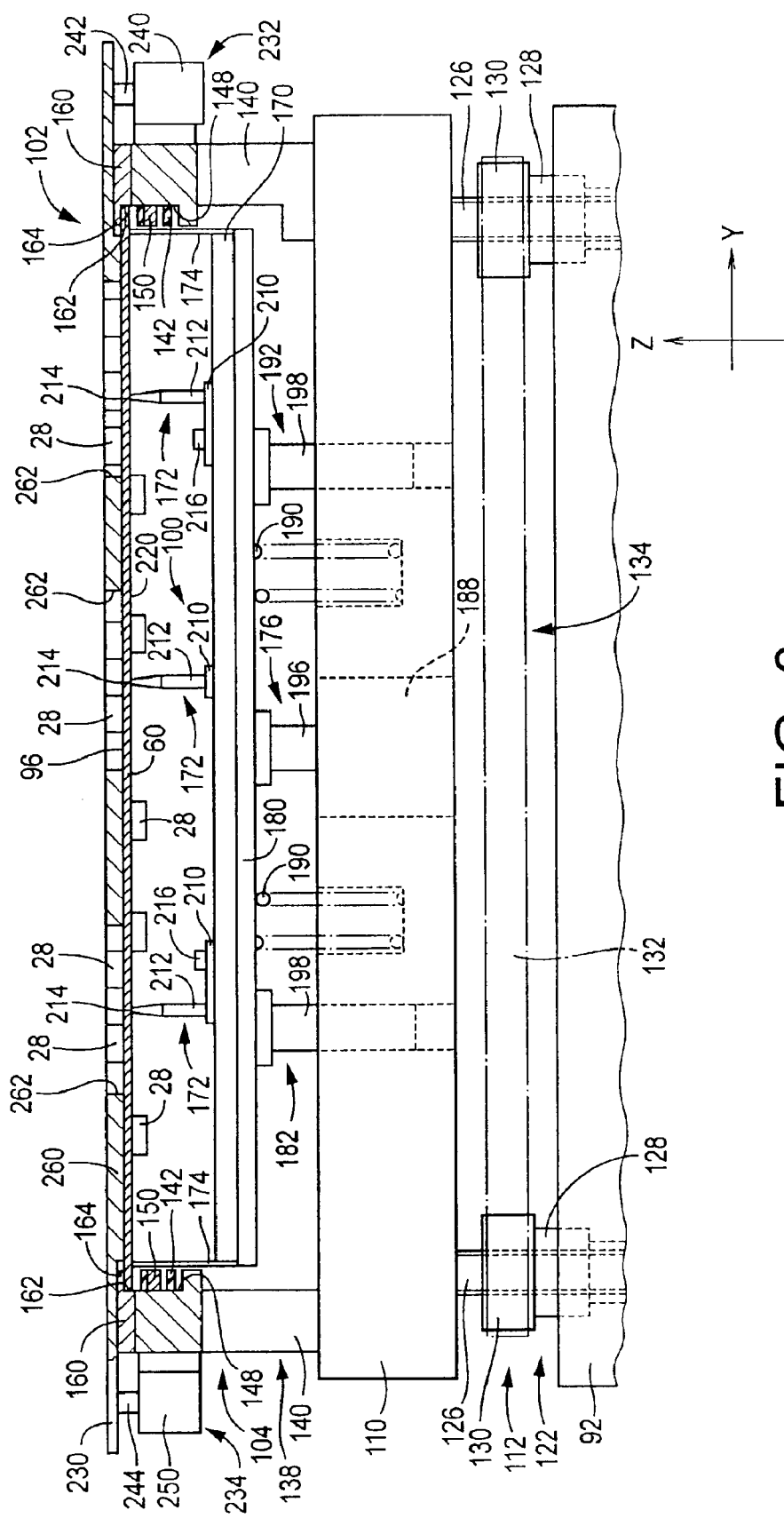
FIG. 3 is a side view (partly in cross section) of the printed-wiring-board holding device in which a printed-wiring board is held by a pressing plate.

The printed-wiring-board holding device 70 is constituted to include a printed-board supporting device in the form of a printed-wiring-board supporting device 100, and a printed-board pressing device in the form of a printed-wiring-board pressing device 102, as shown in FIG. 3.

On the Y-axis slide 92, there is provided a Z-axis slide 110 which constitutes a portion of a main body of the printed-wiring-board holding device 70. The Z-axis slide 110 is movable toward and away from the Y-axis slide 92, namely, is vertically movable in the illustrated example. The Z-axis slide 110 serves also as a movable member or elevating device. A Z-axis direction is perpendicular to each of the X-axis and Y-axis directions, and corresponds to a vertical direction in the present embodiment. The Z-axis slide 110 is elevated and lowered relative to the Y-axis slide 92 by a printed-wiring-board-holding-device moving device or approaching/separating device in the form of an elevating device 112 which is provided in the Y-axis slide 92.

In the present embodiment, the elevating device 112 includes a drive source in the form of an elevating motor 120 (see FIG. 8), and a motion converting device 122 which converts a rotary motion of the elevating motor 120 into a vertical movement of the Z-axis slide 110. The motion converting device 122 includes a plurality of feed screws in the form of ball screws 126 which extend in the vertical direction and are fixed to the Z-axis slide 110, and a plurality of nuts 128 which are provided in the Y-axis slide 92 such that the nuts 128 are rotatable and unmovable in the axial direction. The ball screws 126 are fixed, for example, to respective four corner portions of the Z-axis slide 110. The elevating motor 120 is provided in the Y-axis slide 92. The rotary motion of the elevating motor 120 is transmitted to the plurality of nuts 128 through a rotation transmitting device 134 which includes a plurality of timing pulleys 130 and timing belts 132. With the rotations of the plurality of nuts 128, the plurality of ball screws 126 are moved in the axial direction in synchronization with each other, whereby the Z-axis slide 110 is elevated or lowered by a desired distance while keeping its horizontal posture.

On the Z-axis slide 110, there is provided a wiring-board conveyor 138. As shown in FIG. 3, the wiring-board conveyor 138 includes a guide member in the form of a pair of guide rails 140, a wound body in the form of a pair of conveyor belts 142, and a belt driving device. The pair of guide rails 140 are provided to extend in parallel with the X-axis direction (i.e., a direction perpendicular to the plane of FIG. 3). One of the guide rails 140 consists of a fixed guide rail, while the other of the guide rails 140 consists of a movable guide rail which is movable toward and away from the fixed guide rail in the Y-axis direction. The movable guide rail is manually movable by an operator, or automatically movable by a rail driving device, whereby a conveyor width corresponding to the distance between the movable and fixed rails is changed depending upon the width of the printed-wiring board 60, 354.

The conveyor belts 142 are wound on respective side faces 148 of the guide rails 140 which are opposed to each other. Each of the conveyor belts 142 consists of an endless belt, and has a transferring surface in its upper flat portion. The upper flat portions of the conveyor belts 142 are supported at their lower surfaces by respective elongated guide members 150 which are provided in the respective side faces 148 and extend in parallel with the X-axis direction. The conveyor belts 142 are circulated in synchronization with each other by the belt driving device having a drive source in the form of a board conveying motor 152 (see FIG. 8), whereby the printed-wiring board 60 or 354 placed on the transferring surface of the conveyor belts 142 is transferred in the X-axis direction.

Guide members 160, fixed to upper surfaces of the respective guide rails 140, serve as guide portions of the fixed and movable guide rails and constitute guide means. The guide members 160 consist of plate members having a length substantially equal to that of the guide rails 140, and have respective vertical guide surfaces 162. The printed-wiring board 60 or 354 is guided at its widthwise opposite ends by the vertical guide surfaces 162 which are positioned on respective widthwise opposite sides of the printed-wiring board 60 or 354, so that the printed-wiring board 60 or 354 is guided in the longitudinal direction of the guide rails 140. The guide members 160 further have respective pressing portions 164 integrally formed therein. Each of the pressing portions 164 elongated in the longitudinal direction prevents upward displacement of the printed-wiring board 60 or 354 during transferring of the board 60 or 354, and clamps the printed-wiring board 60 or 354 during mounting of the electronic components 28 onto the board 60 or 354.

On the Z-axis slide 110, the above-described printed-wiring-board supporting device 100 is also provided such that the supporting device 100 can be elevated and lowered. The printed-wiring-board supporting device 100 includes a support table 170, a plurality of support pins 172 which are disposed on the support table 170 and each of which corresponds to a columnar member as a kind of supporting member, and a pair of clamping members 174. The printed-wiring-board supporting device 100 is moved by a supporting-device moving device in the form of a supporting-device elevating device 176 in the vertical direction that is perpendicular to the top surface 96 or 392 of the printed-wiring board 60 or 354.

The supporting-device elevating device 176 is equipped with a movable table in the form of an elevator 180, and an elevator driving device 182. The printed-wiring-board supporting device 100 is removably fixed at the support table 170 to the elevator 180. The elevator driving device 182 includes a drive source in the form of an air cylinder 188 which is provided in the Z-axis slide and extends in the vertical direction, a plurality of compression coil springs (hereinafter simply referred to as springs) 190 which are disposed between the elevator 180 and the Z-axis slide 110 and each of which corresponds to an elastic member as a kind of biasing means for biasing the elevator 180 in the upward direction, and a guide device 192 which guides the vertical movement of the elevator 180. The air cylinder 188 is a kind of a fluid-operated cylinder or fluid-operated actuator.

In the present embodiment, the elevator 180 is elevated owing to biasing force of the spring 190, while the supply of compressed air to the air cylinder 188 is being stopped. When the compressed air is supplied to the air cylinder 188, a piston rod 196 is retracted whereby the elevator 180 is lowered to its lower end position against the biasing force of the spring 190.

The guide device 192 includes a guide member in the form of a plurality of guide rods 198 which are fixed to a lower surface of the elevator 180. The guide rods 198 are fitted in respective guide portions formed in the Z-axis slide 110, and are movable relative to the Z-axis slide 110 in the axial direction for thereby guiding the movement of the elevator 180.

In the illustrated example, the support table 170 of the printed-wiring-board supporting device 100 consists of a plate member, and is removably attached to the elevator 180 by fixing means which is not shown. The support table 170 is adapted to be slightly smaller than the printed-wiring board 60 which is supported by the printed-wiring-board supporting device 100, while the elevator 180 is adapted to have such dimensions that make it possible to attach a printed-wiring-board supporting device 100, capable of supporting a largest printed-wiring board 60, to the elevator 180. In the present embodiment, the printed-wiring-board supporting device 100 is replaced with another printed-wiring-board supporting device 100, depending upon the kind or size of printed-wiring board 60 or 354 which is to be supported.

The above-described pair of clamping members 174 consist of respective plate members, and provided in respective opposite end portions of the support table 170 which are distant from each other in the Y-axis direction such that the clamping members 174 extend in parallel with the direction in which the printed-wiring board is transferred. Although the illustration is not provided, a plurality of internally threaded holes are formed in a portion of the support table 170 which portion corresponds to a central portion of the surface 96 or 392 of the printed-wiring board 60 or 354 which portion is located between the pair of clamping members 174. The plurality of internally threaded holes are arranged in a lattice-point manner. The plurality of support pins 172 are attached to the internally threaded holes such that the support pins 172 are removable from the internally threaded holes and such that the positions of the support pins 172 are adjustable. The central portion of the top surface 96 or 392 is located inside a peripheral portion of the printed-wiring board which is clamped by the pressing portions 164 of the guide rails 140 and the clamping members 174. Similarly, a central portion of a bottom surface 220 or 394 of the printed-wiring board 60 or 354, which is described below, is located inside the peripheral portion of the printed-wiring board which is clamped by the pressing portions 164 of the guide rails 140 and the clamping members 174. The support pins 172, which are constructed as in a support pin device described in JP-A-H11-195899, will be briefly explained.

Each of the support pins 172 includes a base portion 210 having an elongated shape, and a supporting portion 212 extends from a longitudinal end portion of the base portion 210. The supporting portion 212 has a flat distal end face or flat upper end face which constitutes a supporting surface 214. Each support pin 172 is fixed to the support table 170 by fixing means in the form of a bolt 216 which passes through an elongated hole formed through the base portion 210 and extends in parallel with a longitudinal direction of the base portion 210 and which is screwed into a corresponding one of the internally threaded holes formed in the support table 170. The supporting surfaces 214 of the support pins 172 lie on a plane on which distal end faces of the clamping members 174 lie.

The clamping members 174 are positioned in respective positions for clamping the printed-wiring board 60 or 354, and extend in parallel with the direction in which the printed-wiring board is transferred. The support pins 172 are attached to the support table 170 in such a manner that permits the support pins 172 to support predetermined portions of the central portion of the bottom surface 220 or 394 of the printed-wiring board 60 or 354. Although the illustration is not provided, a positioning pin or pins are provided in the elevator 180. The positioning pins serve as positioning members for positioning the printed-wiring board 60 or 354 in a predetermined position. The positioning pins are elevated and lowered together with the printed-wiring-board supporting device 100, so as to be fitted into respective positioning holes which are formed through the printed-wiring board in the thickness direction, whereby the printed-wiring board is positioned in the predetermined position relative to the elevator 180. The printed-wiring-board holding device 70 is disposed on the Z-axis slide 110, such that the support pins 172 are brought into contact with the above-described predetermined portions of the central portion of the bottom surface of the printed-wiring board 60 or 354 while the printed-wiring-board pressing device 102 forces predetermined portions of the central portion of the top surface 96 or 392, after the printed-wiring board 60 or 354 has been loaded onto the wiring-board conveyor 138, namely, when the printed-wiring board 60 or 354 whose loading movement has been stopped by a stopper device (not shown) is positioned in the predetermined position by the above-described positioning pins.

Figure 4:
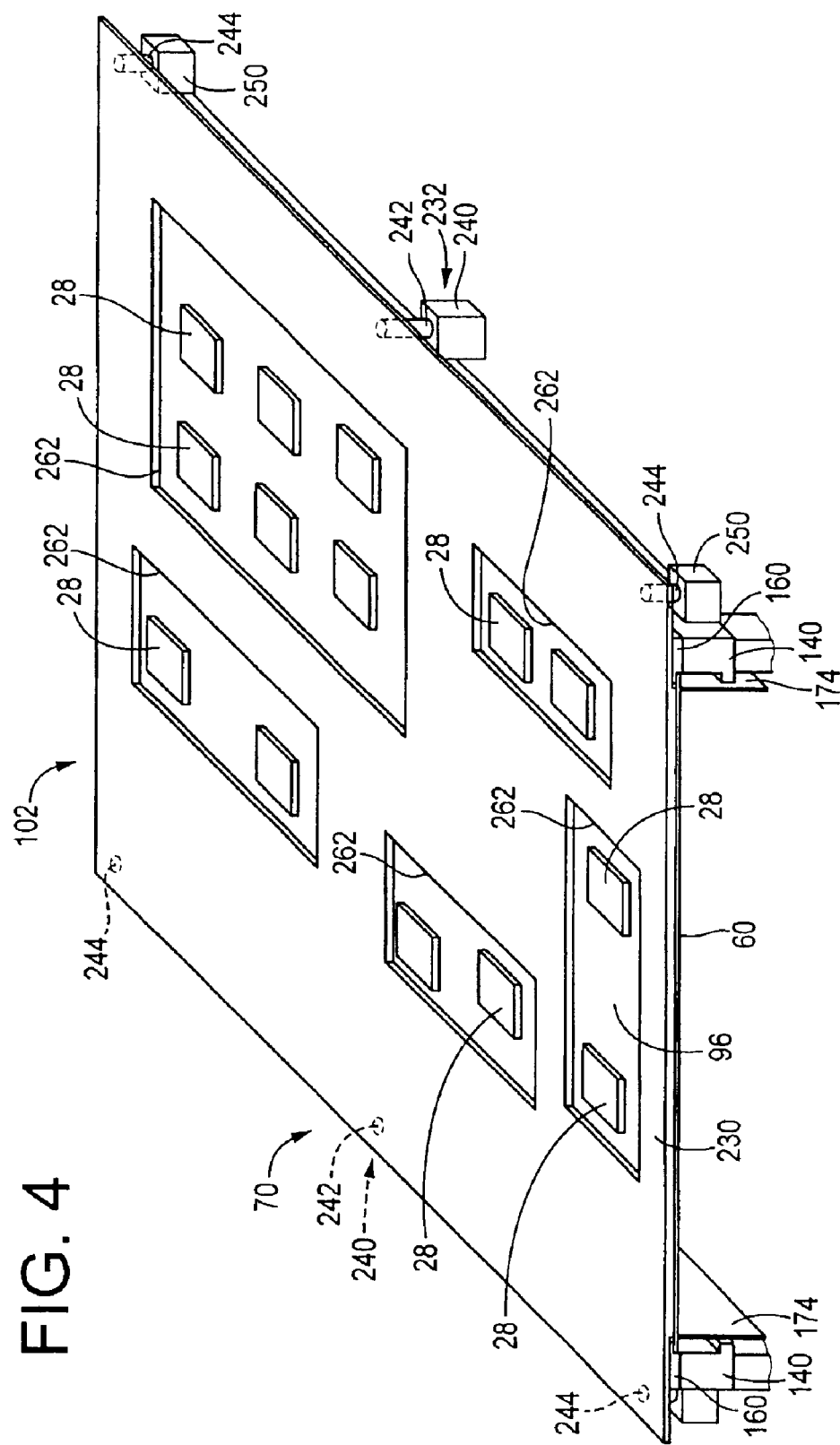
FIG. 4 is a perspective view of a printed-wiring-board pressing device in which the printed-wiring board is pressed by the pressing plate of the above-described printed-wiring-board holding device.
Figure 5:
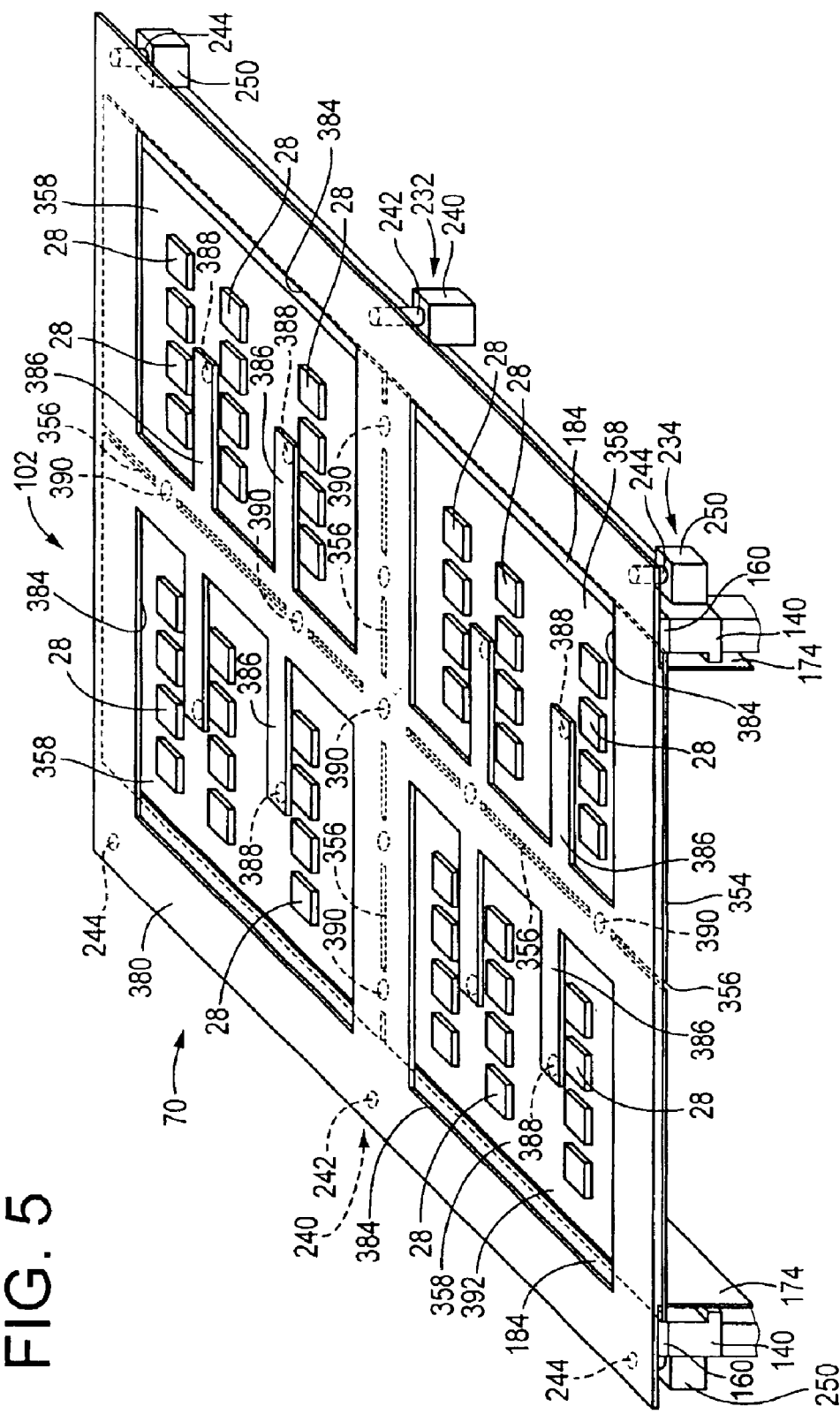
FIG. 5 is a perspective view of a printed-wiring-board pressing device in which the printed-wiring board is pressed by a pressing frame of the above-described printed-wiring-board holding device.

The printed-wiring-board pressing device 102 is provided in the guide rails 140, which are members cooperating with the Z-axis slide 110 to constitute a major portion of the printed-wiring-board holding device 70, and which are also clamping members including the pressing portions 164 that cooperates with the clamping members 174 to clamp the printed-wiring board 60 or 354. As shown in FIGS. 4 and 5, the printed-wiring-board pressing device 102 includes a pressing member in the form of a pressing plate 230 or a pressing frame 380, a moving device in the form of a pressing-member elevating device 232 which moves the pressing plate 230 or pressing frame 380 in its thickness direction, and a guide device 234 which guides the movement of the pressing plate 230 or pressing frame 380 in the thickness direction. The pressing plate 230 and the pressing frame 380 are selectively used depending upon the kind of printed-wiring board. Firstly, the pressing plate 230 will be explained.

The pressing plate 230 is used for holding the printed-wiring board 60, from which a single printed-circuit board is produced by mounting the electronic components 28 onto the printed-wiring board. The pressing plate 230 is larger than the printed-wiring board 60, and has a width larger than a width of the pair of guide rails 140 (i.e., a dimension as measured in a direction perpendicular to the direction in which the printed-wiring board is transferred). Piston rods 242 of respective two air cylinders 240 are provided in respective widthwise opposite end portions of the pressing plate 230 which project outwardly from the respective guide rails 140 as viewed in the width direction on a plane parallel with the top surface 96 of the printed-wiring board 60, as shown in FIGS. 3 and 4. Each of the piston rods 242 is removably engaged with an intermediate portion of the corresponding widthwise end portion as viewed in the direction in which the printed-wiring board is transferred. Each of the two air cylinders 240 is fixed to an outer face of the corresponding guide rail 140, and constitutes the pressing-member elevating device 232. With extension of each piston rod 242, the pressing plate 230 is elevated so as to be separated from the printed-wiring board 60. With retraction of each piston rod 242, the pressing plate 230 is lowered so as to be brought into contact with or into proximity to the printed-wiring board 60.

In each of opposite end portions of the pressing plate 230 which protrude outwardly from the respective guide rails 140, a plurality of guide rods 244, for example, two guide rods 244 are removably engaged with two portions which are distant from each other as viewed in a direction parallel with in a direction in which the printed-wiring board is transferred by the wiring-board conveyor 138 (i.e., in the X-axis direction in the example of the illustration). The guide rods 244 are vertically movably fitted in respective two guide portions 250 which are disposed on an outer surface of each of the guide rails 140, such that each of the guide rods 244 is axially movable relative to the corresponding one of the guide portions 250. The guide rods 244 and the guide portions 250 cooperate to constitute the guide device 234. The guide device 234 guides movement of the pressing plate 230 in the thickness direction, while preventing movement o the pressing plate 230 in the direction parallel with the top surface 96.

The pressing plate 230 has a protrusion portion 260 which protrudes from its lower surface, i.e., from one of its opposite surfaces that is closer to the printed-wiring board 60, toward the printed-wiring board 60. The protrusion portion 260 protrudes from the entirety of a portion of the lower surface of the pressing plate 230 which portion is located between the pair of guide rails 140. A portion of the pressing plate 230 including the protrusion portion 260 has a thickness equal to a thickness of the electronic components 28, as shown in FIGS. 3 and 4. The protrusion portion 260 has a height equal to a thickness of the pressing portion 164 which is provided in each of the guide rails 140.

Openings 262 are formed through the pressing plate 230 such that the openings 262 are located in respective areas of the protrusion portion 260, onto each of which the electronic components 28 will be mounted. Each of the openings 262 is a kind of through-hole, and has such a size that permits a plurality of mutually adjacent electronic components 28 which are located in the corresponding one of areas, to be accommodated in the opening 262. That is, the pressing plate 230 is configured such that the pressing plate 230 is not brought into contact with portions of the top surface 96 of the printed-wiring board 60 on which the electronic components 28 are mounted, namely, such that the pressing plate 230 does not disturb the operation for mounting the electronic components onto the printed-wiring board 60 by the mounting device 16. FIG. 4 illustrates a state in which the electronic components 28 have been already mounted on the respective portions of the printed-wiring board 60, for clarifying the positional relationship between the electronic components 28 and the openings 262.

The pressing plate 230 is made of a material having a light weight and a high rigidity, for example, made of a drumlin which is a kind of metal. When the pressing plate 230 is free, namely, when the pressing plate 230 is positioned by the pressing-member elevating device 232 in its upper end position or a position which is distant from the printed-wiring board 60 and which permits the printed-wiring board 60 to be released from the pressing plate 230, the pressing plate 230 is warped or curved to be convexed toward the printed-wiring board 60.

The pressing frame 380 will be explained. The pressing frame 380 is used for holding the printed-wiring board 354 shown in FIG. 5. The printed-wiring board 354 is a so-called plural-sheets-providing printed-wiring board, from which a plurality of printed-circuit boards are obtained, by dividing the printed-wiring board into the plurality of boards. That is, after the electronic components 28 mounted onto the printed-wiring board 354 have been electrically connected to the printed circuit, the printed-wiring board 354 is divided into the plurality of boards, so that the plurality of printed-circuit boards are obtained from the printed-wiring board 354.

The printed-wiring board 354 has a plurality of sections separated from each other by a plurality of boundary portions. In the present embodiment, the printed-wiring board 354 has a plurality of slits 356 which are arranged to form a cross shape and which divide the printed-wiring board 354 into four sections 358. In each of the sections 358, the electronic components 28 are mounted in the same pattern.

After the printed circuits and the electronic components have been electrically connected, namely, after each of printed circuits of the respective sections has been completed, the printed-wiring board 354 is divided at the slits 356 whereby a plurality of identical printed-circuit boards are obtained. In the illustrated example, four printed-circuit boards which are identical to each other are obtained. The printed-wiring board 354 may be considered as an integration of a plurality of printed-wiring boards which are dividable from each other. It is noted that the electronic components 28 may be mounted in respective patterns in the plurality of sections such that the patterns includes at least two patterns different in kind from each other, so that a plurality of kinds of printed-circuit boards can be obtained.

The pressing frame 380, which consists of a rectangular plate member, has four openings 384 formed therethrough in a direction of the thickness of the pressing frame 380, such that each adjacent pair of openings 384 is arranged in a longitudinal direction or a width direction of the pressing frame 380. Two arm portions 386, each provided by an elongated portion having a small width, project from an inner circumferential surface of each of the openings 384. The openings 384 are formed in respective portions of the pressing frame 380 which are other than a peripheral portion of the pressing frame 380 and portions corresponding to the slits 356 of the printed-wiring board 354 and which correspond to portions of the printed-wiring board 354 providing the respective printed-circuit boards. Each of the arm portions 386 extends in parallel with the top surface 392 of the printed-wiring board 354 such that the arm portion 386 is not positioned above the portions of the top surface 392 on which portions the electronic components 28 will be mounted by the mounting device 16. Each arm portion 386 has at least one protrusion portion 388 protruding from a distal end portion of a surface of the arm portion 386 which surface is opposed to the printed-wiring board 354, toward the printed-wiring board 354. In the illustrated example, each arm portion 386 has one protrusion portion 388.

Figure 6:
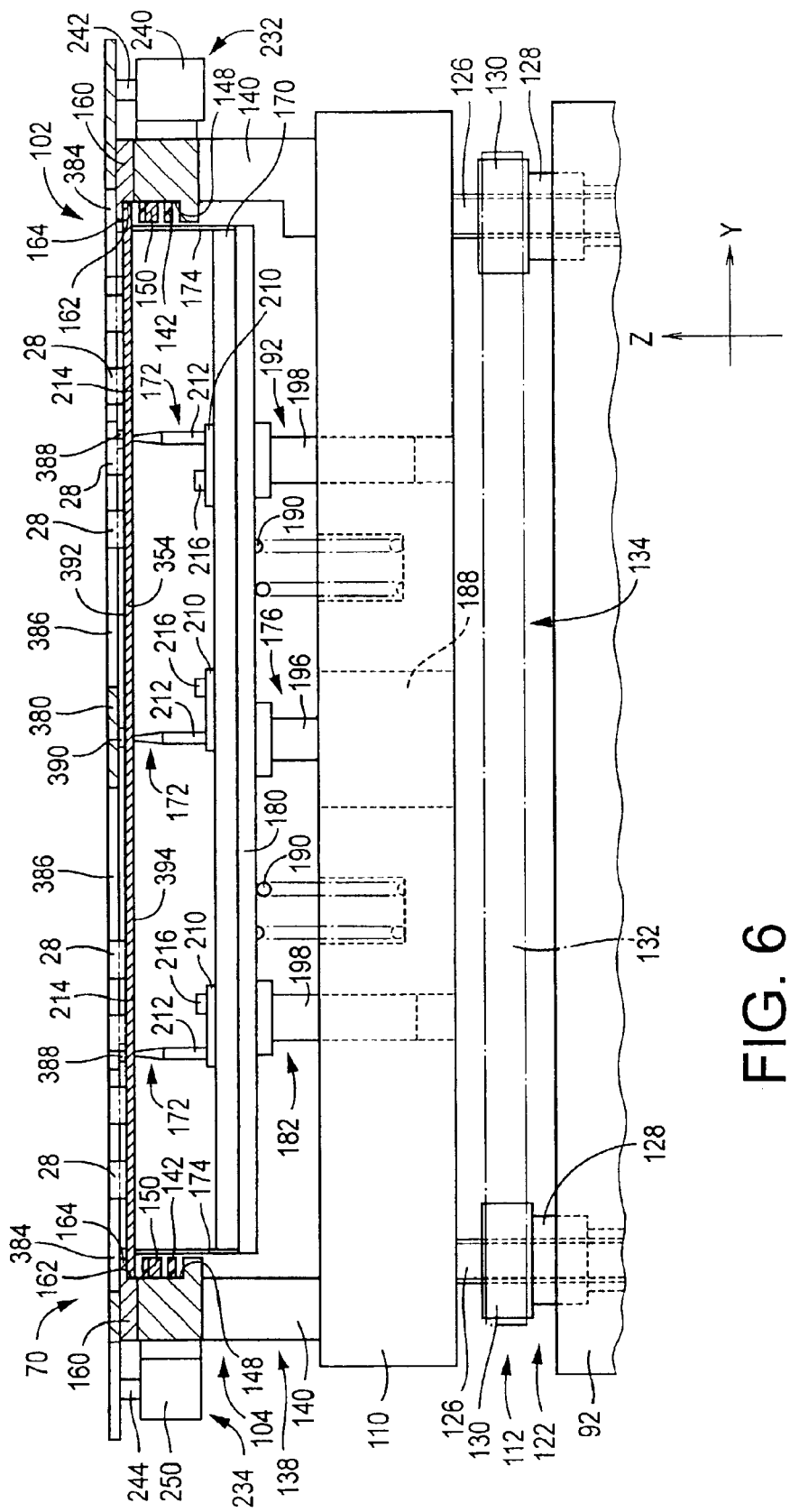
FIG. 6 is a side view (partly in cross section) of the printed-wiring-board holding device in which the printed-wiring board is held by the pressing frame.
Figure 7:
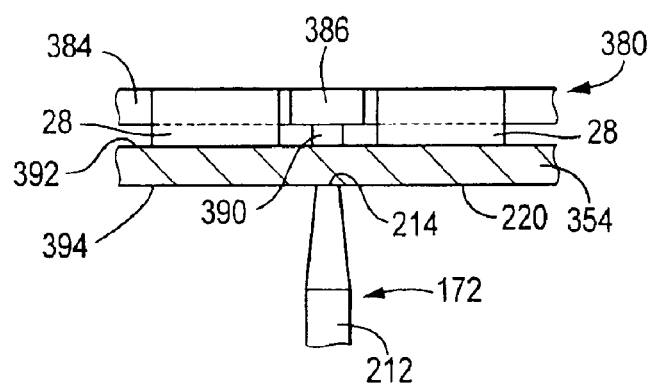
FIG. 7 is a cross-sectioned side view of a portion of the pressing frame in which openings and protrusion portions are formed.

A protrusion portion 390, which is similar to the protrusion portion 388, is formed in each portion of the surface of the pressing frame 380 opposed to the printed-wiring board 354, which portion corresponds to a portion between each adjacent pair of the slits 356 of the printed-wiring board 354, as shown in FIGS. 6 and 7. Like the protrusion portions 388, the protrusion portions 390 protrude toward the printed-wiring board 354.

Each of the protrusion portions 388, 390 has a circular shape in its cross section that is perpendicular to its axis. As shown in FIG. 6, each of the protrusion portions 388, 390 has a height equal to the thickness of the pressing portion 164, while a portion of the pressing frame 380 including each of the protrusion portions 388, 390 has a thickness equal to the thickness of the electronic components 28.

The pressing frame 380 is larger than printed-wiring board 354. Like the pressing plate 230, the pressing frame 380 is removably engaged with the piston rods 242 of the air cylinders 240 of the pressing-member elevating device 232 and also with the guide rods 244 of the guide device 192. The pressing frame 380 is elevated and lowered by the pressing-member elevating device 232 so as to be moved in the thickness direction, while the movement of the pressing frame 380 in the thickness direction is guided by the guide device 192. The movement of the pressing frame 380 in the direction parallel with its surface is prevented by the guide device 380.

Like the pressing plate 230, the pressing frame 380 is made of a material having a light weight and a high rigidity, for example, a drumlin which is a kind of metal. When portions of the pressing frame 380 defining the four openings 384, i.e., a frame portion corresponding to the peripheral portion of the pressing frame 380 and a dividing portion corresponding to a portion positioned above the slits 356 of the printed-wiring board 354 are free, namely, when the pressing frame 380 is positioned by the pressing-member elevating device 232 in its upper end position or a position which is distant from the printed-wiring board 354 and which permits the printed-wiring board 354 to be released from the pressing frame 380, the pressing frame 380 is curved to be convexed toward the printed-wiring board 354.

Figure 8:
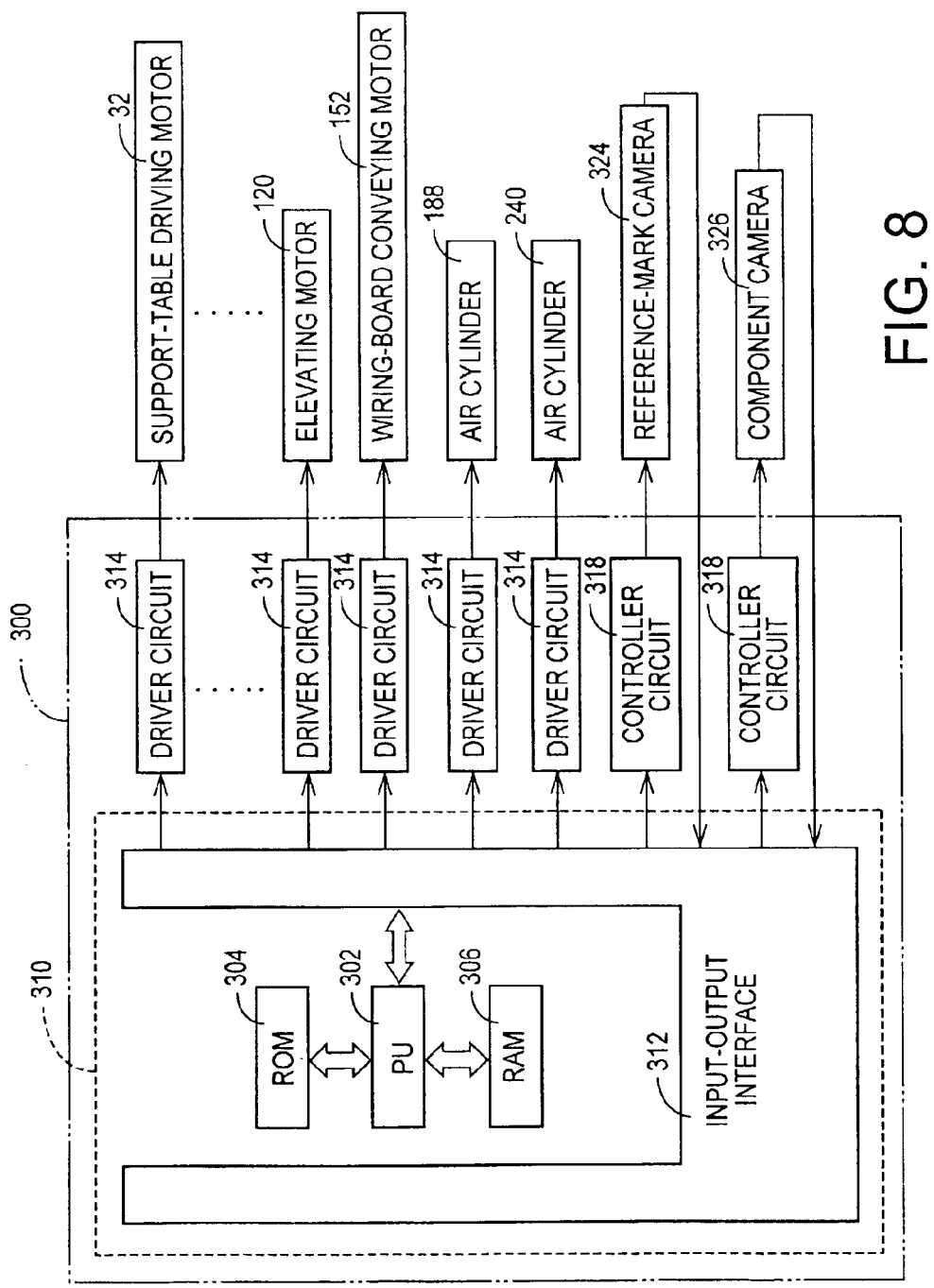
FIG. 8 a block diagram showing portions of a control device which controls the above-described electronic-component mounting system, which portions relate to the present invention.

The present electronic-component mounting system is controlled by a control device 300 which is shown in FIG. 8. The control device 300 is principally constituted by a computer 310 including a PU (processing unit) 302, a ROM 304, a RAM 306 and a bus interconnecting those elements 302, 304 and 306. Although the illustration is not provided, to the bus, there is connected an input-output interface 312 to which are connected various sensors used, for example, in an operation for mounting the electronic components 28 onto the printed-wiring board 60.

To the input-output interface 312, there are also connected various actuators such as the support-table driving motor 32, through respective driver circuits 314. The support-table driving motor 32 and other motors used as the drive sources are rotary electric motors in the form of servomotors whose operating angle can be controlled with a high degree of accuracy in the present embodiment. However, stepping motors may be used in place of the servomotors. Although the illustration is not provided, the operating angles of those drive sources such as the support-table driving motor 32 are detected by respective operating-angle detecting devices in the form of rotary encoders. The drive sources such as the support-table driving motor 32 are controlled on the basis of the output signals of the rotary encoders.

To the input-output interface 312, there are also connected a reference-mark camera 324 and a component camera 326 through respective control circuits 318. The reference-mark camera 324 is used for taking images of a plurality of reference marks, for example, two reference marks (not shown) provided on the top surface 96 of the printed-wiring board 60, and is held stationary, as shown in FIG. 1. The component camera 326 is used for taking an image of the electronic component 28 held by the mounting head 52, and is provided in the above-described component-posture detecting position. In the present embodiment, each of the reference-mark camera 324 and the component camera 326 is constituted by a CCD camera including a matrix of CCDs (charge-coupled devices) and a lens system, and consists of an image taking device capable of taking a two-dimensional image of an object at one time. The RAM 306 stores various programs such as a program for mounting the electronic components 28 onto the printed-wiring board 60 or 354, and also data required for executing the programs.

The operation for mounting the electronic components 28 onto the printed-wiring board 60 will be explained. In this case, the pressing plate 230 is used for holding the printed-wiring board 60, and the pressing plate 230 is brought into engagement with the piston rods 242 of the air cylinders 240 of the pressing-member elevating device 232 and also with the guide rods 244 of the guide device 192. In the printed-wiring-board supporting device 100, the support pins 172 are disposed in predetermined positions on the support table 170, for supporting the printed-wiring board 60. In the illustrated example, the electronic components 28 have been already mounted on the bottom surface 220 which is a lower surface of the printed-wiring board 60. Therefore, the support pins 172 are attached to such positions on the support table 170 that permit the support pins 172 to be brought into contact with portions of the central portion of the bottom surface 220 on which portions the electronic components 28 are not mounted. That is, the support pins 172 are attached to such positions on the support table 170 that permit the support pins 172 to support the printed-wiring board 60 without being brought into contact with the portions of the central portion of the bottom surface 220 on which portions the electronic components 28 are not mounted.

When the electronic components 28 are mounted onto the printed-wiring board 60, the printed-wiring board 60 is loaded onto the printed-wiring-board positioning device 18 by a printed-wiring-board loading device (not shown), and is then held by the printed-wiring-board holding device 70. With upward movement of the Z-axis slide 110 by the elevating device 112, the printed-wiring-board holding device 70 is positioned to be aligned with positions of the printed-wiring-board loading and unloading devices in a horizontal plane, and is positioned in its upper end position corresponding to a delivery position in which the printed-wiring board 60 is delivered between the printed-wiring-board loading and unloading devices. In this instance, the printed-wiring-board supporting device 100 of the printed-wiring-board holding device 70 is held in its lower end position corresponding to a non-working or release position in which the printed-wiring board 60 is released without being supported, while the pressing plate 230 of the printed-wiring-board pressing device 102 of the printed-wiring-board holding device 70 is held in its upper end position.

The printed-wiring board 60, which has been loaded by the printed-wiring-board loading device, is disposed on the pair of conveyor belts 142 of the wiring-board conveyor 138 of the printed-wiring-board holding device 70, so that the printed-wiring board 60 is moved onto the printed-wiring-board supporting device 100. After the movement of the printed-wiring board 60 has been stopped by the stopper device (not shown), the printed-wiring-board supporting device 100 is elevated by the supporting-device elevating device 176, whereby the pair of clamping members 174 are brought into contact with the bottom surface 220 of the printed-wiring board 60. The printed-wiring board 60 is lifted up from the conveyor belts 142 by the clamping members 174, so that widthwise opposite end portions of the printed-wiring board 60 which are elongated in parallel with the printed-wiring-board transferring direction are forced onto the respective pressing portions 164 provided in the guide rails 140. Thus, the widthwise opposite end portions of the printed-wiring board 60 are gripped and clamped by the pair of pressing portions 164 and the pair of clamping members 174 from respective opposite sides of the printed-wiring board 60, whereby the printed-wiring board 60 is fixed to the printed-wiring-board holding device 70.

Further, the plurality of support pins 172 are brought into contact at their respective supporting surfaces 214 with the central portion of the bottom surface 220, whereby the printed-wiring board 60 is supported at the central portion of the bottom surface 220 by the support pins 172 which are positioned on the lower side of the printed-wiring board 60. This arrangement permits the printed-wiring board 60 to be lifted up by the support pins 172 so as to be flattened, where the printed-wiring board 60 is convexed in the downward direction. The positioning pins are elevated with the upward movement of the printed-wiring-board supporting device 100, and are fitted into the respective positioning holes which are formed through the printed-wiring board 60 in the thickness direction whereby the printed-wiring board 60 is positioned relative to the printed-wiring-board holding device 70.

The pressing plate 230 is lowered by the pressing-member elevating device 232, simultaneously with the upward movement of the printed-wiring-board supporting device 100, or alternatively, before or after the upward movement of the supporting device 100. The pair of air cylinders 240 of the pressing-member elevating device 232 are activated concurrently with each other, whereby the pressing plate 230 is lowered. The lower end of the vertical movement of the pressing plate 230 is defined by the contact of the pressing plate 230 with the upper surfaces of the pair of guide rails 140. It is noted that the positioning pins for positioning the printed-wiring board 60 relative to the printed-wiring-board holding device 70 are fitted into through-holes (not shown) which are formed through the pressing plate 230, for avoiding interference of the positioning pins with the pressing plate 230. It is also noted that the provision of the positioning pins is not essential and may be omitted.

With the pressing plate 230 being held in contact with the guide rails 140, the protrusion portion 260 of the pressing plate 230 is positioned between the guide rails 140 and is held in contact with the top surface 96 of the printed-wiring board 60, whereby the printed-wiring board 60 is forced in a direction away from the top surface 96 toward the bottom surface 220. The position in which the pressing plate 230 is held in contact with the upper surfaces of the guide rails 140 is referred to as a lower end position, working position or pressing position. In this respect, the guide rails 140 constitutes a stopper or a lower-end-position or pressing-position defining position.

With the lower movement of the pressing plate 230 being stopped by the pair of guide rails 140, the pressing plate 230 is forced onto the upper surfaces of the guide rails 140. The pressing plate 230 thus forced onto the upper surfaces of the guide rails 140 is elastically deformed so as to be flattened without convexity toward the printed-wiring board 60. Further, in this instance, a pressing surface, which is provided by a protruding end surface of the protrusion portion 260 having the height equal to the thickness of the pressing portions 164 of the guide rails 140, is positioned to lie on a plane on which clamping surface provided by the lower surfaces of the pressing portions 164 also lie. Therefore, even where the printed-wiring board 60 has an upward convexity on the top surface 96, the protrusion portion 260 reliably forces the central portion of the printed-wiring board 60 against the support pins 172, thereby making it possible to hold the printed-wiring board 60 with the upper surface being satisfactorily flattened. With the pressing plate 230 being brought into contact with the guide rails 140 by the activation of the pressing-member elevating device 232, a bending moment acts on the pressing plate 230 in such a direction that causes the pressing plate 230 to be upwardly convexed. However, unless this bending moment is made larger than another bending moment that acts on the pressing plate 230 when the downwardly-convexed pressing plate 230 is deformed to be flattened, there is no possibility that the pressing plate 230 may be actually convexed in the upward direction, namely, there is no possibility that the central portion of the pressing plate 230 may be separated from the printed-wiring board 60. In the present embodiment, the amount of application force of the pressing-member elevating device 232 and the amount of curvature of the pressing plate 230 are determined such that this condition is satisfied.

During the operation for mounting the electronic components 28 onto the printed-wiring board 60, the pressing plate 230 is held in its pressing position for pressing the printed-wiring board 60, while the support pins 172 support the printed-wiring board 60 from the bottom surface 220, so that the electronic components 28 are mounted onto the printed-wiring board 60 which is restrained from its opposite sides by the support pins 172 and the pressing plate 230. The pressing plate 230 is brought into contact at the protruding end surface of the protrusion portion 260 with the top surface 96 of the printed-wiring board 60, for pressing the printed-wiring board 60. However, owing to the provision of the openings 262, the pressing plate 230 is not brought into contact with the portions of the top surface 96 onto which portions the electronic components 28 will be mounted, so that these portions of the top surface 96 are upwardly open through the respective openings 262.

When the electronic components 28 are mounted onto the printed-wiring board 60, the Z-axis slide 110 is lowered such that the printed-wiring-board holding device 70 holding the printed-wiring board 60 is moved to the mounting position that is located below the delivery position. The position to which the printed-wiring-board holding device 70 is lowered is adjusted such that the top surface 96 of the printed-wiring board 60 has a height suitable for the mounting of the electronic components 28. After the printed-wiring-board holding device 70 has been lowered to the mounting position, the printed-wiring-board holding device 70 is moved by the printed-wiring-board moving device 72 while being held in the mounting position. The plurality of portions of the printed-wiring board 60, onto which the electronic components 28 are to be mounted, are sequentially positioned in a position corresponding to the component-mounting position of the mounting device 16.

In the mounting device 16, the intermittent rotation motor 54 is activated for intermittently rotating the intermittent rotary disk 50, whereby the plurality of mounting heads 52 are sequentially moved to and stopped at the component receiving position, the component mounting position and other stop positions. Each of the mounting heads 52 is elevated and lowered by the mounting-head elevating device, while being positioned in the component receiving position, for receiving the electronic component 28 from the component supply portion of the feeder 26 which is positioned in the component supply position, and then mounting the electronic component 28 onto the printed-wiring board 60 that is held by the printed-wiring-board holding device 70.

Before being positioned in the component-mounting position, the mounting head 52 is positioned in the component-posture detecting position in which an image of the electronic component 28 as held by the mounting head 52 is obtained by the component camera 326, for thereby detecting and rectifying errors as to the positioning of the electronic component 28 as held by the mounting head 52. The errors include center positioning errors or horizontal positioning errors $\Delta XE$ and $\Delta YE$, and also an angular positioning error $\Delta\theta$. The center positioning errors or horizontal positioning errors $\Delta XE$ and $\Delta YE$ represent a misalignment of the center of the electronic component 28 with respect to the rotational axis of the suction nozzle 58 in a plane perpendicular to the rotational axis. The angular positioning error $\Delta\theta$ represents an error of positioning of the electronic component 28 about an axis perpendicular to the surface of the electronic component 28 at which the electronic component 28 is held by the suction nozzle 58.

Further, the images of the reference marks provided on the printed-wiring board 60 are taken, for thereby detecting and rectifying the positioning errors $\Delta XP$ and $\Delta YP$ of the portions of the printed-wiring board 60 onto which the electronic components 28 are to be mounted. The angular positioning error Δθ of the electronic component 28 is rectified, by rotating the mounting head 52 and the electronic component 28 with activation of a head rotating device which is provided in the component-posture rectifying position. The center positioning errors ΔXE and ΔYE are rectified, by changing the movement distance of the printed-wiring board 60. In this instance, the movement distance of the printed-wiring board 60 is changed on the basis of not only the center positioning errors ΔXE and ΔYE but also the rectifications of the positioning errors ΔXP and ΔYP and the angular positioning error Δθ.

When the mounting head 52 holding the electronic component 28 is positioned in the component-mounting position, the mounting head 52 is lowered by the mounting-head elevating device so that the mounting head 52 places or mounts the electronic component 28 onto the top surface 96 of the printed-wiring board 60. In this instance, the mounting head 52 passes through a corresponding one of the openings 262 formed through the pressing plate 230, so as to mount the electronic component 28 onto the printed-wiring board 60. In the illustrated example in which the portion of the pressing plate 230 including the protrusion portion 260 has the thickness equal to the thickness of the electronic components 28, there is no risk of interference of the suction nozzle 58 with the pressing plate 230, when the electronic component 28 is mounted on the printed-wiring board 60 by the suction nozzle 58 of the mounting head 52. The printed-wiring board 60 is supported by the support pins 172 which are held in contact with the lower surface of the board 60, while the printed-wiring board 60 is forced downwardly by the pressing plate 230 which is held in contact with the upper surface of the board 60, whereby the printed-wiring board 60 is held flattened. The distance between the top surface 96 of the printed-wiring board 60 and the suction nozzle 58 positioned in the upper end position is held in a suitable amount, so that the electronic component 28 is brought into abutting contact with the top surface 96, without risk of damage of the electronic component 28. Thus, the electronic component 28 is reliably mounted onto the printed-wiring board 60.

After all the electronic components 28 have been mounted on each printed-wiring board 60, the state of mounting of the electronic components 28 is checked. In the present embodiment, this check is made by using the reference-mark camera 324. To this end, the printed-wiring-board holding device 70 holding the printed-wiring board 60 is moved by the printed-wiring-board moving device 72 such that the mounted electronic components 28 are sequentially moved to an image-taking position which is located below the reference-mark camera 324, whereby images of the mounted electronic components 28 are taken by the reference-mark camera 324.

Data representative of the taken images of the mounted electronic components 28 are processed, whereby it is checked, for example, whether the electronic components 28 are mounted on the printed-wiring board 60, or whether the electronic components 28 are mounted in respective correct positions with correct postures. Since the pressing plate 230 covers the top surface 96 of the printed-wiring board 60 except the portions on which the electronic components 28 have been mounted, images of members other than the mounted electronic components 28 are hardly taken. This arrangement facilitates identifications of the electronic components 28, and makes it possible to easily and rapidly execute image processing.

After the check has been completed, the printed-wiring board 60 is unloaded. In this instance, the printed-wiring-board holding device 70 is moved by the printed-wiring-board moving device 72 while being elevated by the elevating device 112, whereby the printed-wiring-board holding device 70 is horizontally and vertically moved to the delivery position in which the printed-wiring-board holding device 70 delivers the printed-wiring board 60 to the printed-wiring-board unloading device (not shown).

After the printed-wiring-board holding device 70 has been moved to the delivery position, the pressing plate 230 is elevated so as to be separated from the top surface 96 of the printed-wiring board 60, while the printed-wiring-board supporting device 100 is lowered so as to separate the support pins 172 and the claming members 174 from the bottom surface 220 of the printed-wiring board 60, whereby the printed-wiring board 60 is released. The printed-wiring board 60 is lowered together with the downward movement of the printed-wiring-board supporting device 100, and is mounted onto the pair of conveyor belts 142 so as to be supported from below. The printed-wiring-board supporting device 100 is then further lowered, whereby the printed-wiring board 60 is released. After the printed-wiring board 60 has been released, the wiring-board conveyor 138 is activated whereby the printed-wiring board 60 is unloaded by the printed-wiring-board unloading device, while another printed-wiring board 60 onto which the electronic components 28 are to be mounted is loaded onto the printed-wiring-board positioning device 18.

Where the kind of printed-wiring board, to which the electronic components 20 are to be mounted, is changed from the printed-wiring board 60 to the printed-wiring board 354, for example, the pressing plate 230 is replaced by the pressing frame 380. The pressing plate 230 is removed from the piston rods 242 of the air cylinders 240 and the guide rods 244 of the guide device 232, and the pressing frame 380 is attached to the piston rods 242 and the guide rods 244.

Where the printed-wiring board 354 is pressed by the pressing frame 380, in the present embodiment, the printed-wiring-board supporting device 100 is adapted such that the support pins 172 are attached to the support table 170 in such a manner that permits the supporting portions 212 to support portions of the bottom surface 394 of the printed-wiring board 354 which portions are pressed by the protrusion portions 388, 390, as shown in FIGS. 6 and 7. That is, each of the support pins 172 and a corresponding one of the protrusion portions 388, 390 are arranged to grip the same portion of the printed-wiring board 354 from respective opposite sides of the board 354, for thereby cooperating with each other to hold the printed-wiring board 354. The support pins 172 may be arranged such that some of the support pins 172 support portions of the printed-wiring board 354 which are not pressed by the protrusion portions 388, 390. Where the printed-wiring board 354 has the electronic components 28 already mounted on the bottom surface 394, the support pins 172 are arranged in such a manner that permits the support pins 172 to support the bottom surface 194 of the printed-wiring board 354 without interfering the mounted electronic components 28.

When the printed-wiring board 354 is pressed by the pressing frame 380, the printed-wiring board 354 is supported from below by the printed-wiring-board supporting device 100 which is elevated by the supporting-device elevating device 176, as when the printed-wiring board 60 is pressed by the pressing plate 230. The pressing frame 380 is lowered by the pressing-member elevating device 232, whereby opposite end portions of the pressing frame 380 each elongated in a direction parallel with the X-axis direction are forced against the upper surfaces of the respective guide rails 140, while the protrusion portions 388, 390 are brought into contact with respective spot portions of the top surface 392 of the printed-wiring board 354. Each of the protrusion portions 388 is brought into contact with a portion located between the portions onto which the electronic components 28 will be mounted, while each of the protrusion portions 390 is brought into contact with a portion located between the slits 356, whereby the printed-wiring board 354 is pressed by the protrusion portions 388, 390. Either of each protrusion portion 388 and each protrusion portion 390 cooperate with a corresponding one of the support pins 172 to grip the same portion of the printed-wiring board 354 from respective opposite sides of the board 354, for thereby pressing and holding the printed-wiring board 354.

The pressing frame 380 is forced against the upper surfaces of the guide rails 140, and is accordingly elastically deformed to be flattened without convexity toward the printed-wiring board 354. In this instance, a pressing surface, which is provided by a protruding end surface of each of the protrusion portions 388, 390 having the height equal to the thickness of the pressing portions 164 of the guide rails 140, is positioned to lie on a plane on which clamping surface provided by the lower surfaces of the pressing portions 164 also lie. Therefore, even where the printed-wiring board 354 has an upward convexity on the top surface 392, the protrusion portions 388, 390 reliably force the central portion of the printed-wiring board 354 against the support pins 172, thereby making it possible to hold the printed-wiring board 354 with the upper surface being satisfactorily flattened. As in the case of the pressing plate 230, a bending moment acts on the pressing frame 380 in such a direction that causes the pressing frame 380 to be upwardly convexed. However, the amount of application force of the pressing-member elevating device 232 and the amount of curvature of the pressing frame 380 are suitably determined in such a manner that inhibits the pressing frame 380 from being actually convexed in the upward direction, for eliminating a possibility of separation of the central portion of the pressing frame 380 from the printed-wiring board 354.

Since each of the support pins 172 and a corresponding one of the protrusion portions 388, 390 are arranged to support the same portion of the printed-wiring board 354 from respective opposite sides of the board 354, as shown in FIGS. 6 and 7, the printed-wiring board 354 is firmly held. Although the printed-wiring board 354 is easily deflectable due to the provision of the slits 356 formed therethrough, the printed-wiring board 354 is held without being deflected or fractured, since the portions between the slits 356 are held by the protrusion portions 390 and the support pins 172.

The electronic components 28 are mounted onto the top surface 392 of the printed-wiring board 354 with a relatively high density of the components 28. However, owing to the arrangement in which the pressing frame 380 is adapted to be forced at the protrusion portions 388, 390 against the printed-wiring board 354, it is possible to bring the pressing frame 380 into contact with the spot portions of the top surface 392 on which the electronic components 28 are not mounted, and to thereby press the printed-wiring board 354. Particularly, it is easy to bring the support pins 172 and the protrusion portions 390 into contact with the boundary portion or portions which have the slits 356 and which are located between the four sections 358 of the printed-wiring board 354, because the electronic components 28 are not mounted onto the boundary portions. Further, since the portion of the pressing frame 380 including each of the protrusion portions 388, 390 has the thickness equal to the thickness of the electronic components 28, the pressing frame 380 does not disturb the operation for mounting the electronic components 28 onto the printed-wiring board 354 by the suction nozzle 58.

Even in a case of a printed-wiring board such as the printed-wiring board 60 from which a single printed-circuit board is produced by mounting the electronic components 28 onto the printed-wiring board, the pressing plate can be replaced with another pressing plate, if the printed-wiring board is changed to another board which is different in kind, dimensions or arrangement of the electronic components 28 to be mounted thereon. That is, it is possible to employ a pressing plate which has a size suitable for the size of the printed-wiring board, and which have openings or through-holes formed through its portions corresponding to the portions of the top surface of the printed-wiring board onto which the electronic components will be mounted. Similarly, also in the printed-wiring-board supporting device 100, it is possible to change the support table 170, the support pins 172 and the clamping members 174 depending upon the kind of printed-wiring board. That is, the clamping members 174 are provided on the support table 170 which has a size suitable for the size of the printed-wiring board 60, while the support pins 172 are attached to such portions of the support table 170 that permit the support pins 172 to support predetermined portions of the printed-wiring board 60. It is noted that the support table 170 may be adapted to be serve as a common support table for supporting each of a plurality of different kinds of printed-wiring boards.

Also in a case of a printed-wiring board such as the printed-wiring board 354 from which a plurality of printed-circuit boards are produced by mounting the electronic components 28 onto the printed-wiring board, the pressing frame can be replaced with another pressing frame, if the printed-wiring board is changed to another board which is different in kind, dimensions or arrangement of the electronic components 28 to be mounted thereon. The printed-wiring-board supporting device 100 also can be adapted to be suitable for the printed-wiring board. It is noted that the pressing frame may be used for holding the printed-wiring board such as the printed-wiring board 60 from which a single printed-circuit board is produced by mounting the electronic components 28 onto the printed-wiring board, and may be used for holding also the printed-wiring board such as the printed-wiring board 354 from which a plurality of printed-circuit boards are produced by mounting the electronic components 28 onto the printed-wiring board. That is, a plurality of pressing members such as pressing plates and frames are selectively used depending upon the kind of printed wiring board.

The pressing-member elevating devices 232 and guide devices 234 are provided in the pair of guide rails 140, as described above. The air cylinder 240, the guide rods 244 and the guide portions 250 provided in the movable one of the guide rails 140 are moved when the movable guide rail 140 is moved to change the conveyor width based upon the width of the printed-wiring board, whereby these elements 240, 244, 250 are moved toward or away from the elements 240, 244, 250 provided in the fixed guide rail 140. Thus, the distance between each pair of the elements 240, 244, 250 is changed depending upon the width of the printed-wiring board. The piston rods 242 of the air cylinders 140 and the guide rods 244 are engaged with a selected one of the pressing plates and frames 230, 380 which has a size suitable for the width of the printed-wiring board, whereby the selected pressing plate or frame can be elevated and lowered by the pressing-member elevating device 232 while being guided by the guide device 234.

Figure 9:
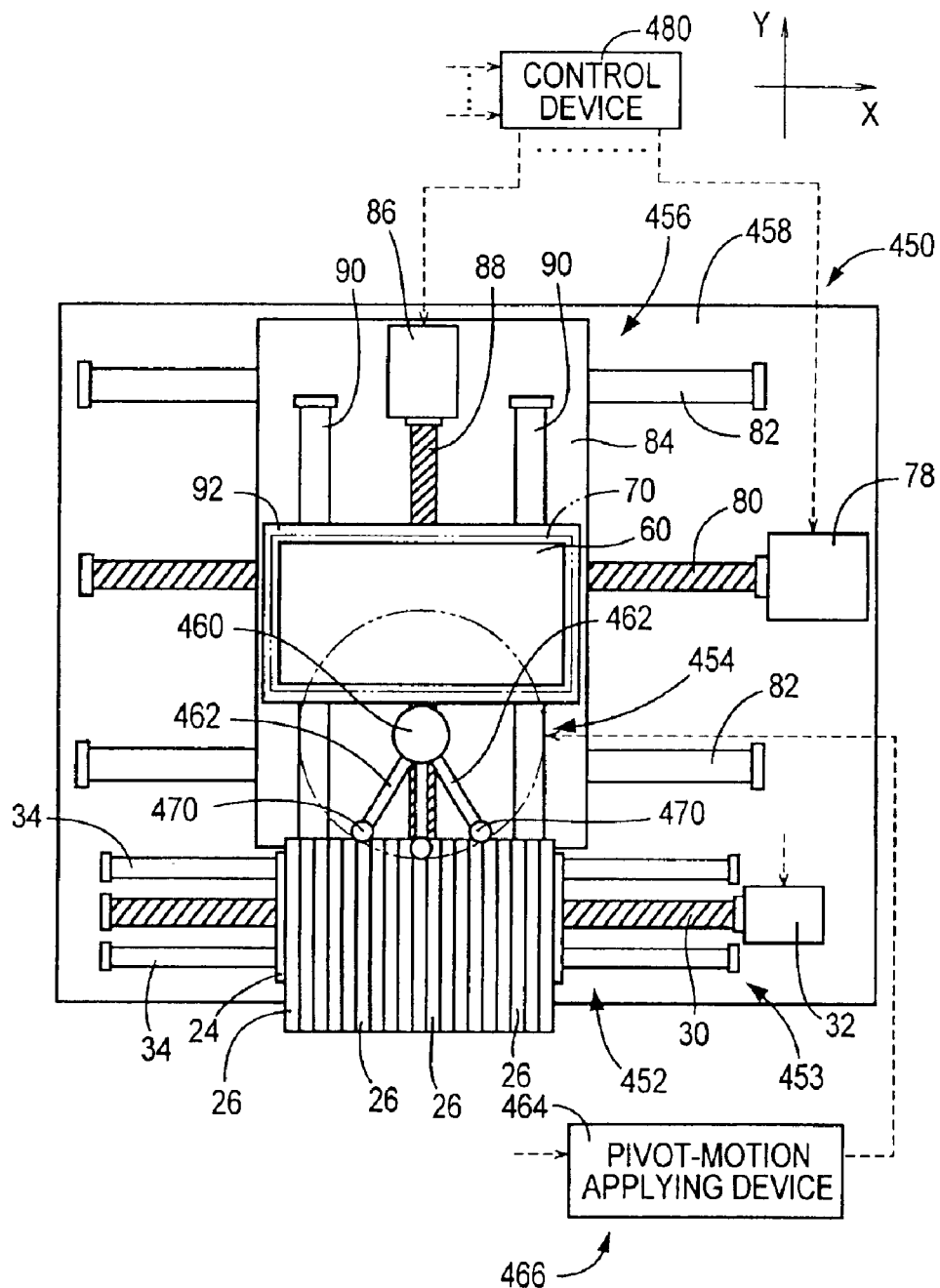
FIG. 9 is a schematic plan view of an electronic-component mounting system including a printed-wiring-board holding device which is constructed according to another embodiment of the present invention.

In the above-described embodiments, the mounting device 16 is equipped with the rotary disk which is rotatable about the axis, so that the plurality of mounting heads are mounted on the rotary disk are turned by the rotation of the rotary disk, so as to be sequentially stopped in the plurality of stop positions, for example, for receiving the electronic components and mounting the electronic components onto the printed-wiring board. However, the mounting device may be provided by pivot members which are pivotable about an axis, and a plurality of mounting heads which are provided in the respective pivot members such that each mounting head is axially movable and rotatable, so that the plurality of mounting heads can be turned by the pivot movements of the pivot members, so as to be sequentially stopped in the plurality of stop positions, as in the following embodiment which will be explained by reference to FIG. 9.

An electronic-component mounting system 450 of the present embodiment includes a component supplying device 452, a component-supplying-device moving device 453, a mounting device 454 and a printed-wiring-board positioning device 456. The component supplying device 452, the component-supplying-device moving device 453 and the printed-wiring-board positioning device 456 have respective constructions identical with those of the corresponding devices in the above-described embodiments. The same reference numerals as used in the above-described embodiments will be used to identify the functionally corresponding elements, and explanation of these elements of the system of this embodiment will not be provided. Further, since the mounting device 454 has a construction similar to a mounting device described in JP-A-H9-237997, the mounting device 454 will be briefly explained.

On a base 458 of the electronic-component mounting system 450, a support shaft 460 is provided to extend in perpendicular to the top surface of the printed-wiring board 60, in the vertical direction in the present embodiment. A plurality of pivot plates 462 as the pivot members are attached to the support shaft 460 such that the pivot plates 462 are pivotable about an axis of the support shaft 460 independently of each other. The pivot plates 462 are pivoted by a pivot-motion applying device 464. The pivot-motion applying device 464 has a drive source in the form of a servo motor that is a kind of electric motor, and a motion-converting device including a cam follower in the form of a cam follower that is provided in each of the plurality of pivot plates 462 and a plurality of cams, for example, four globoidal cams. The rotation of the servo motor is converted by the motion-converting device into a pivot motion of each of the plurality of pivot plates 462. The pivot plates 462 are pivoted independently of each other with a predetermined time difference between the pivot motions of the respective pivot plates 462. The pivot plates 462 and the pivot-motion applying device 464 cooperate to constitute a mounting-head turning device 466 serving as a mounting-head moving device.

A mounting head 470 is provided in each of the plurality of pivot plates 462. The mounting head 470 has a suction nozzle adapted to suck the electronic component with application of vacuum pressure to the electronic component. The mounting head 470 is provided in each pivot plate 462, such that the mounting head 470 is movable in the vertical direction, i.e, in a direction parallel with a pivot axis about which the pivot plates 462 are pivoted, and such that the mounting head 470 is rotatable about an axis by a corresponding one of rotating devices which are provided in the respective pivot plates.

In the illustrated example, each of the pivot plates 462 is stopped in a component receiving position, a component-posture detecting position and a component mounting position. In the component receiving position and the component mounting device, the mounting head 470 is elevated by the mounting-head elevating device so as to receive the electronic component or so as to mount the electronic component onto the printed-wiring board. In a component-posture detecting device, an image of the electronic component held by the suction nozzle is taken by a component camera whereby an error as to the positioning of the electronic component held by the suction nozzle is calculated on the basis of the taken image. In the illustrated example, the printed-wiring-board moving device 72, the component-supplying-device moving device 453, the mounting-head turning device 466 and the mounting-head elevating device cooperate to constitute a relative movement device. Further, a control device 480, whose major portion is provided by a computer as the above-described control device 300, is provided to control the relative movement device and other devices.

Each of the plurality of pivot plates 462 is not stopped in any position except in the above-described three positions. That is, only three of the mounting heads 462, each of which is currently positioned in a corresponding one of the three positions for executing the corresponding operation, are stopped while the other mounting heads 462 are being moved. In other words, each of the mounting heads 462 is stopped only in the three positions, so that each of the mounting heads 462 is kept being pivoted except when being positioned in one of the three positions. This arrangement makes it possible to reduce the time interval between a point of time at which each mounting head 462 arrives in one of the stop positions, and a point of time at which the following mounting head 462 arrives in the stop position, for thereby reducing a time required for mounting the electronic components onto the printed-wring board 60, and accordingly making it possible to mount the electronic components onto the printed-wring board 60 with high efficiency.

In the electronic-component mounting system 450, too, the printed-wiring board 60, 354 is held by the printed-wiring-board holding device 70 when the electronic components are mounted onto the printed-wiring board 60, 354.

The mounting device may be provided by a device in which each mounting head is moved in the XY coordinate plane that is parallel with the top surface of the printed-wiring board, for receiving the electronic component and mounting the electronic component onto the printed-wiring board, as in the following embodiment which will be explained by reference to FIGS. 10–12. It is noted that an electronic-component mounting system of the embodiment, which is basically constructed as described in JP-B2-2824378 except the printed-wiring-board holding device, will be briefly explained.

Figure 10:
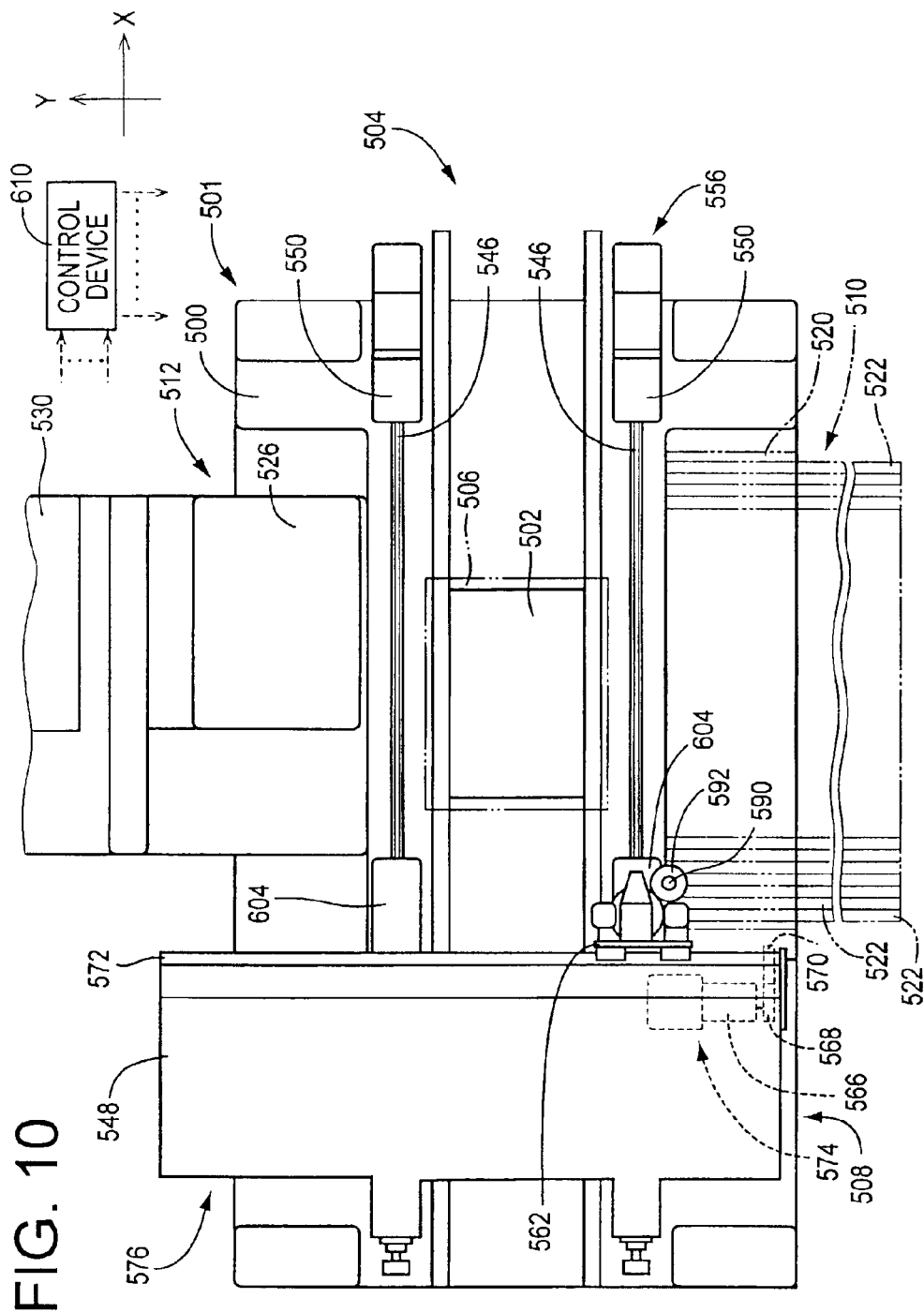
FIG. 10 is a schematic plan view of an electronic-component mounting system including a printed-wiring-board holding device which is constructed according to still another embodiment of the present invention.

In FIG. 10, reference numeral 500 denotes a base of an electronic-component mounting system 501. On the base 500, there are mounted a wiring-board conveyor 504, a printed-wiring-board holding device 506, a mounting device 508 and component supplying devices 510, 512. The wiring-board conveyor 504 serves to transfer a printed-wiring board 502 in the X-axis direction (in the right and left directions as seen in FIG. 10).

In the present embodiment, the printed-wiring board 502 is transferred by the wiring-board conveyor 504 such that the printed-wiring board 502 maintains a horizontal posture. The wiring-board conveyor 504 is stopped by a suitable stopper device (not shown), to locate the printed-wiring board 502 in a predetermined component-mounting position. The printed-wiring board 502 located in the component-mounting position is supported by the printed-wiring-board holding device 506 which is provided in a portion of the base 500 corresponding to the component mounting position, such that the top surface of the printed-wiring board 502 maintains a horizontal posture. In the illustrated example, since the wiring-board conveyor 504 and the printed-wiring-board holding device 506 have respective constructions similar to those of the above-described wiring-board conveyor 138 and the printed-wiring-board holding device 70, detailed illustration and explanation of the wiring-board conveyor 504 and the printed-wiring-board holding device 506 will not be provided. In the printed-wiring-board holding device 506 in which the base 500 constitutes a main body of the device, the printed-wiring-board supporting device and the pressing member which are provided on the main body are elevated and lowered, respectively, whereby the printed-wiring board 502 is pressed from its opposite sides, so as to be supported and held. It is noted that the a supporting portion may provided in the base 500 so that the supporting portion constitutes the main body of the printed-wiring-board holding device.

Figure 11:
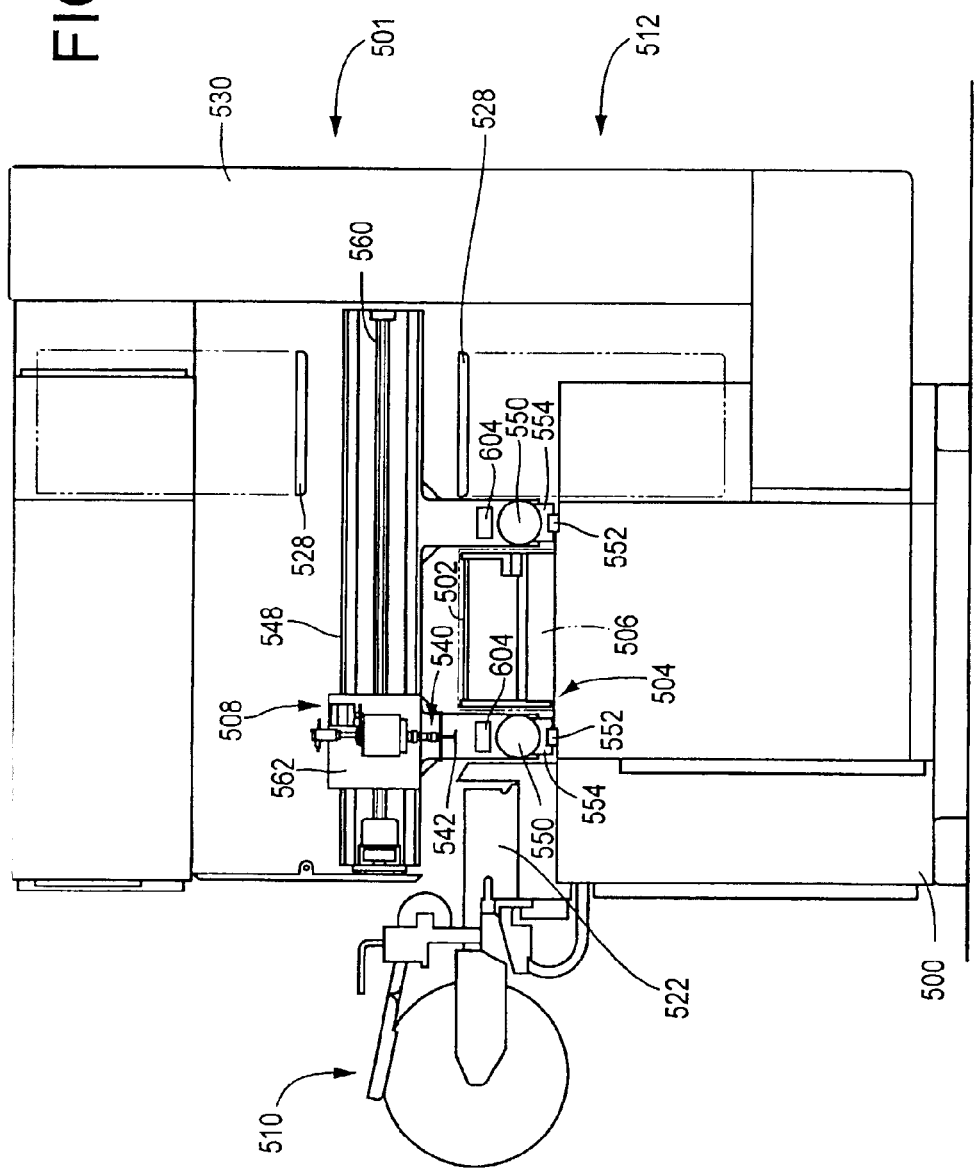
FIG. 11 is a schematic side view of the electronic-component mounting system of FIG. 10.

The component supplying devices 510, 512 are spaced from each other in a Y-axis direction perpendicular to the X-axis direction, and located on the opposite sides of the wiring-board conveyor 504, as shown in FIGS. 10 and 11. In the illustrated example, the component supplying device 510 consists of a feeder-type component supplying device, while the component supplying device 512 consists of a tray-type component supplying device. Like the above-described component supplying device 14, the feeder-type component supplying device 510 includes a feeder support table 520, and a plurality of feeders 522 removably mounted on the feeder support table 520. The plurality of feeders 522 are mounted on the feeder support table 520 such that the component supply portions of the respective feeders 522 are arranged in a straight line parallel with the X-axis direction. In the illustrated example, each of the feeders 522 is arranged to feed a carrier tape which accommodates the electronic components, as each of the above-described feeders 26.

The tray-type component supplying device 512 accommodates the electronic components in component trays 526 (see FIG. 10) for supplying the electronic components. The component trays 526 are accommodated in respective multiple tray accommodating boxes 528 (see FIG. 11), which are vertically arranged and are supported by respective support members (not shown). The tray accommodating boxes 528 are elevated one after another by an elevating device disposed within a column 530, to a component supply position. For a mounting head (which will be described) to take the electronic components out of the component tray 526, some space must be provided above the component-supply position. To provide this space, the tray accommodating box 528, which has supplied the electronic components, is moved further upwardly from the component supply position when the next tray accommodating box 528 is moved to the component supply position. That is, in this instance, the tray accommodating box 528 which has supplied the electronic components is moved upwardly by a distance corresponding to the required space, so as to be moved to a predetermined retracted position. Since this tray-type component supplying device 512 has a construction similar to that of a component supplying device described in JP-B2-H2-57719, the explanation is not provided.

As described above, the mounting device 508 takes the electronic components one after another out of the component tray 526 in the tray accommodating box 528 above which the required space is provided. As shown in FIG. 12, a mounting head 540 of the mounting device 508 is movable in the mutually perpendicular X-axis and Y-axis directions, so that the mounting head 540 can take a linear movement having X-axis and Y-axis components, to carry each electronic component 542 for mounting the component 542 onto the top surface, i.e., the mount surface of the printed-wiring board 502.

To this end, as shown in FIG. 10, two ball screws 546 are provided on opposite sides of the wiring-board conveyor 504 of the base 500 as viewed in the Y-axis direction such that the ball screws 546 extend in parallel with the X-axis direction. Two nuts 549 (only one of which is shown in FIG. 12) are provided in a X-axis slide 548, and are engaged with the respective ball screws 546, so that the X-axis slide 548 is moved to a desired position in parallel with the X-axis direction when the ball screws 546 are rotated by X-axis slide driving motors 550. As shown in FIG. 10, the X-axis slide 548 has a length bridging between the feeder-type component supplying device 510 and the tray-type component supplying device 512 which are located on opposite sides of the wiring-board conveyor 504. On the base 500, guide rails 552 serving as a guiding member are provided to be located below the respective two ball screws 546, so that the X-axis slide 548 is slidably engaged at guide blocks 554, serving as a guided member, with the guide rails 552. Thus, the movement of the X-axis slide 548 is guided by the guide rails 552. The nuts 549, the ball screws 546 and the X-axis slide driving motors 550 cooperate to constitute a major portion of a X-axis slide moving device 556.

Figure 12:
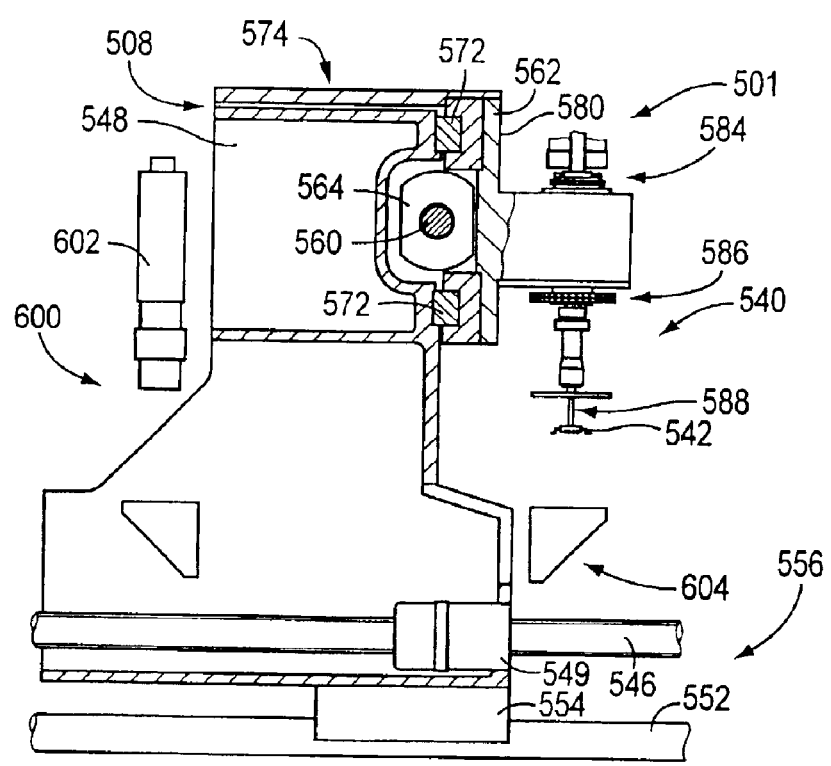
FIG. 12 is a schematic front view (partly in cross section) of the electronic-component mounting system of FIG. 10.

As shown in FIG. 12, a ball screw 560 is provided on the X-axis slide 548 such that the ball screw 560 extends in parallel with the Y-axis direction. A nut 564 provided in a Y-axis slide 562 is engaged with the ball screw 560. When the ball screw 560 is rotated by a Y-axis slide moving device 566 (see FIG. 10) through gears 568, 570, the Y-axis slide 562 is moved to a desired position in parallel with the Y-axis direction while being guided by a guide member in the form of a pair of guide rails 572. The nut 564, the ball screw 560 and the Y-axis slide driving motor 566 cooperate to constitute a major portion of a Y-axis slide moving device 574. This Y-axis slide moving device 574 cooperates with the X-axis slide 548, the X-axis slide moving device 556 and the Y-axis slide 562 to constitute a mounting-head moving device 576, by which the mounting head 540 is moved to be positioned in a desired position in a horizontal plane that is parallel with the top surface of the printed-wiring board 502.

On a side surface 580 provided by a vertical surface of the Y-axis slide 562, as shown in FIGS. 11 and 12, there are disposed an elevating device 584 and a rotating device 586 together with the mounting head 540. The elevating device 584 serves to elevate and lower the mounting head 540, while the rotating device 586 serves to rotate the mounting head 540 about its axis. The mounting head 540 constitutes a major portion of a component mounting unit. The elevating device 584 and the mounting-head moving device 576 cooperate to constitute a relative movement device.

The mounting head 540 is equipped with a suction nozzle 588 as a kind of component holder which is adapted to such the electronic component with application of a vacuum pressure to the electronic component. While the single component mounting unit is provided in the present embodiment, a plurality of component mounting units may be provided. For example, such a plurality of component mounting units can be provided in the Y-axis slide 562 so as to be arranged in a line parallel with the Y-axis direction. Since the component mounting unit of the present embodiment has a construction similar to that of a component mounting unit described in JP-B2-3093339, the explanation is not provided.

A reference mark camera 590 (see FIG. 10) is also provided in the Y-axis slide 562 such that the camera 590 is unmovable relative to the Y-axis slide 562. This reference mark camera 590 serves to take image of reference marks provided on the printed-wiring board 502. In the present embodiment, the reference mark camera 590 is constituted by a CCD camera, and provides an image taking device capable of taking a two-dimensional image of an object at one time. An illuminating device 592 is also provided together with the reference mark camera 590, for illuminating the reference marks and their vicinities.

As shown in FIG. 10, two image taking systems 600 are unmovably attached to respective portions of the X-axis slide 548, such that the two image taking systems 600 are positioned in respective positions in which the respective two ball screws 546 for moving the X-axis slide 548 are disposed. Namely, one of the two image taking systems 600 is located between the feeder-type electronic-component supply device 510 and the printed-wiring board 502, while the other image taking system 600 is located between the tray-type electronic-component supply device 512 and the printed-wiring board 502. Each image taking system 600 is equipped with an image taking device which includes a component camera 602 and a light guide device 604, as in an image taking device described in a specification of Japanese Patent application 2000-343641 which has been filed by the applicant of the present application and which has not yet disclosed. The thus constructed image taking system 600 serves to take a silhouette image of the electronic component. When the image of the electronic component is taken, the electronic component is illuminated by an illuminating device (not shown). These image taking device and illuminating device constitute the image taking system.

The present electronic-component mounting system 501, whose detailed illustration and explanation are omitted, is controlled by a control device 610 which has a major portion by constituted by a computer as the above-described control device 300.

In the electronic-component mounting system 501, the mounting head 540 is moved by the relative movement device 576, for receiving the electronic component 542 from one of the component supplying devices 510, 512. After having received the electronic components 542 from the one of the component supplying devices 510, 512, the mounting head 540 is moved to the printed-wiring board 502 and then mounts the electronic component 542 onto the board 502. On the way from the one of the component supplying devices 510, 512 toward the printed-wiring board 502, the mounting head 540 is stopped in a Y-axis position in which a corresponding one of the image taking systems 600 is disposed, so that the image of the electronic component 542 is taken in the Y-axis position, whereby an error as to the positioning of the electronic component 542 held by the mounting head 540 is detected. The angular positioning error of the electronic component 542 is rectified by rotating the mounting head 540 by the rotating device 586, while the horizontal positioning error of the electronic component 542 is rectified by rectifying the movement distance of the mounting head 540. In this instance, a misalignment of the electronic component 542 with respect to the portion of the printed-wiring board 502, onto which the electronic component 542 is to be mounted, is likely to be caused by the rectification of the positioning error of the printed-wiring board 502 and the rectification of the angular positioning error of the electronic component 542. Such a misalignment of the electronic component 542 is rectified together with the rectifications of the angular and horizontal positioning errors of the electronic component 542.

The printed-wiring board 502 is held by the printed-wiring-board holding device 506 such that the printed-wiring board 502 is held flattened without being curved. Therefore, the mounting head 540 can reliably mount the electronic components 542 onto the printed-wiring board 502 without risk of damage of the electronic components 542.

While the moving devices in the form of the pressing-member elevating devices 232 are provided independently of the guide devices 192 in the above-described printed-wiring-board holding device 70, the moving devices may be adapted to serve as the guide devices. For example, it is possible to adapt the pressing-member elevating device to include four air cylinders such that piston rods of the respective four air cylinders are engaged with four corner portions of the pressing plate, so that the pressing plate can be elevated and lowered by simultaneous activations of the air cylinders. In this arrangement, the vertical movement of the pressing plate is guided by the movements of the four piston rods relative to cylinder housings of the respective air cylinders, so that the air cylinders serve also as the guide devices.

Further, where the printed-wring board is pressed by a pressing frame such as the pressing frame 380 having the protrusion portions, the support members of the printed-wiring-board supporting device may be arranged to support respective portions of the printed-wiring board which portions are not pressed by the protrusion portions of the pressing frame.

Further, the pressing member may be provided by a columnar member.

Further, the mounting head may be provided by a component chucking tool which is equipped with a chucking member in the form of a plurality of chucking jaws, so that the electronic component is held by opening and closing movements of the chucking jaws. The component chucking tool is a kind of component holder.

Further, the component supplying device may include two component-supplying tables on each of which a plurality of feeders are disposed such that component supply portions of the feeders are arranged in a line, for example, as described in JP-B2-H8-21791. Each of the two component-supplying tables is moved by a component-supplying-table moving device, so as to supply the electronic components. In such a component supplying device, the two component-supplying tables may supply the electronic components in various manners. For example, the two component-supplying tables may cooperate with each other to supply the electronic components. Alternatively, either one of the two component-supplying tables may supply the electronic components. The component supplying device may include three or more component-supplying tables.

While the several embodiments of this invention have been described above in detail, for illustrative purpose only, it is to be understood that the present invention may be embodied with various other changes and modifications, such as those described in the object to be achieved by the invention and in the object achieving measurement and technical effect, which can be made on based on knowledge of those skilled in the art.

What is claimed is:

1. A printed-board holding device for holding a printed board in a work system in which the printed board and a working head are moved relative to each other in a direction parallel with a top surface of the printed board so that the working head executes a desired operation in each of a plurality of predetermined portions of the top surface of the printed board, said printed-board holding device comprising:

a supporting member which is to be brought into contact with a central portion of a bottom surface of the printed board and is capable of supporting the central portion; and a pressing member which is to be brought into contact with a central portion of the top surface and is capable of forcing the printed board toward said supporting member, wherein said supporting member and said pressing member are brought into contact with the central portions of the respective bottom and top surfaces prior to execution of the operation by the working head, and are held in contact with the central portions of the respective bottom and top surfaces during the execution of the operation for the plurality of predetermined portions of the top surface of the printed board.

2. A printed-board holding device according to claim 1, wherein at least one of said pressing member and said supporting member includes a plate member which has a plurality of through-holes formed through said plate member in a direction of a thickness of said plate member.

3. A printed-board holding device according to claim 2, further comprising:

a guide device which is capable of guiding movement of said plate member in said direction of said thickness and preventing movement of said plate member in said direction parallel with the top surface of the printed board; and a moving device which is capable of moving said plate member, guided by said guide device, in said direction of said thickness.

4. A printed-board holding device according to claim 2, wherein said plate member has, in a surface thereof opposed to the printed board, a protrusion portion which protrudes toward the printed board.

5. A printed-board holding device according to claim 2, wherein said plate member is curved to be convexed toward the printed board.

6. A printed-board holding device according to claim 1, wherein said pressing member includes a plate member which has a plurality of through-holes formed through said plate member in a direction of a thickness of said plate member, and wherein said supporting member includes a generally columnar member which has a distal end face to be brought into contact with the printed board.

7. A printed-board holding device according to claim 1, wherein said pressing member and said supporting member have respective portions which are positioned relative to each other such that said respective portions can be brought into contact with each other via the printed board interposed between said respective portions.

8. A printed-board holding device according to claim 1, further comprising:

a pair of guide members having respective guide surfaces which are opposed to each other in a horizontal direction and which are to be brought into contact with respective opposite ends of the printed board, wherein said supporting member includes a contactable portion which is to be brought into contact with the central portion of the bottom surface of the printed board and which is located between said guide surfaces as viewed in said horizontal direction, and wherein said pressing member includes a contactable portion which is to be brought into contact with the central portion of the top surface of the printed board and which is located between said guide surfaces as viewed in said horizontal direction.

9. A printed-board holding device according to claim 1, further comprising:

a table which supports said supporting member disposed on said table; and a clamping mechanism which is capable of clamping opposite end portions of the printed board such that the opposite end portions of the printed board have the same distance from said table, wherein said supporting and pressing members are positioned relative to said clamping mechanism, such that said printed board can be brought into contact at the central portions of the bottom and top surfaces with said supporting and pressing members while said printed board is being clamped at the opposite end portions by said clamping mechanism.

10. An electric-component mounting system, comprising:

a printed-board holding device which includes (a) a supporting member to be brought into contact with a central portion of a bottom surface of a printed board so as to support the central portion, and (b) a pressing member to be brought into contact with a central portion of a top surface of the printed board so as to force the printed board toward said supporting member;

a mounting head which is capable of executing an operation to mount an electric component onto the printed board held by said supporting member and said pressing member of said printed-board holding device, which are brought into contact with the central portions of the respective bottom and top surfaces prior to execution of the operation by said mounting head, and which are held in contact with the central portions of the respective bottom and top surfaces during the execution of the operation by said mounting head;

a component supplying device which is capable of supplying the electric component to said mounting head; and a relative movement device which is capable of moving said mounting head and said component supplying device relative to each other, and moving said mounting head and said printed-board holding device relative to each other.

* * * * *